United States Patent
Takahashi et al.

(10) Patent No.: US 8,207,734 B2
(45) Date of Patent: Jun. 26, 2012

(54) PARALLEL IMAGING IN NON-CARTESIAN MAGNETIC RESONANCE IMAGING (MRI) AND MRI APPARATUS REALIZING THE SAME

(75) Inventors: Tetsuhiko Takahashi, Tokyo (JP); Masahiro Takizawa, Tokyo (JP); Yasuhiro Kamada, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 402 days.

(21) Appl. No.: 12/529,396

(22) PCT Filed: Mar. 3, 2008

(86) PCT No.: PCT/JP2008/053761
§ 371 (c)(1),
(2), (4) Date: Sep. 1, 2009

(87) PCT Pub. No.: WO2008/111416
PCT Pub. Date: Sep. 18, 2008

(65) Prior Publication Data
US 2010/0039110 A1 Feb. 18, 2010

(30) Foreign Application Priority Data
Mar. 9, 2007 (JP) .................................. 2007-059506

(51) Int. Cl.
*G01V 3/00* (2006.01)
(52) U.S. Cl. ....................................................... 324/310
(58) Field of Classification Search ........... 324/300–322
See application file for complete search history.

(56) References Cited

U.S. PATENT DOCUMENTS

| | | | | |
|---|---|---|---|---|
| 6,717,406 B2* | 4/2004 | Sodickson | .................... | 324/307 |
| 6,965,232 B2* | 11/2005 | Sodickson | .................... | 324/307 |
| 7,800,368 B2* | 9/2010 | Vaughan et al. | .............. | 324/318 |
| 7,843,195 B2* | 11/2010 | Ruhm | ........................... | 324/309 |
| 2006/0232273 A1 | 10/2006 | Takizawa et al. | | |
| 2007/0182412 A1 | 8/2007 | Katscher et al. | | |

FOREIGN PATENT DOCUMENTS

JP 2004-344183 12/2004
WO WO2005/069031 A1 7/2005

OTHER PUBLICATIONS

Liu, Chunlei, et al., "Simultaneous Phase Correction and SENSE Reconstruction for Navigated Multi-Shot DWI with Non-Cartesian k-Space Sampling", *Magnetic Resonance in Medicine*, vol. 54, pp. 1412-1422 (2005).

Nezafat, Reza, et al., "Real Time High Spatial-Temporal Resolution Flow Imaging with Spiral MRI using Auto-Calibrated SENSE", *Proceedings of the 26th Annual International Conference of the IEEE EMBS*, pp. 1914-1917 (Sep. 2004).

* cited by examiner

*Primary Examiner* — Dixomara Vargas
(74) *Attorney, Agent, or Firm* — Cooper & Dunham LLP

(57) ABSTRACT

An MRI apparatus capable of performing a high-speed operation for removing aliasing from the data measured by non-Cartesian imaging in a real space with a small amount of operation is provided. Non-Cartesian data sampling is performed by thinning the number of data by using multiple receiver coils having different sensitivity distribution from each other. Image reconstruction means creates orthogonal data by gridding non-orthogonal data obtained by each receiver coil on a grid having an equal spatial resolution to and a narrower field of view than a target image, subjects it to Fourier transform and creates the first image data containing aliasing components. The second image data is created by using the first image data created for each receiver coil and a sensitivity distribution of each receiver coil.

20 Claims, 14 Drawing Sheets

FIG.13
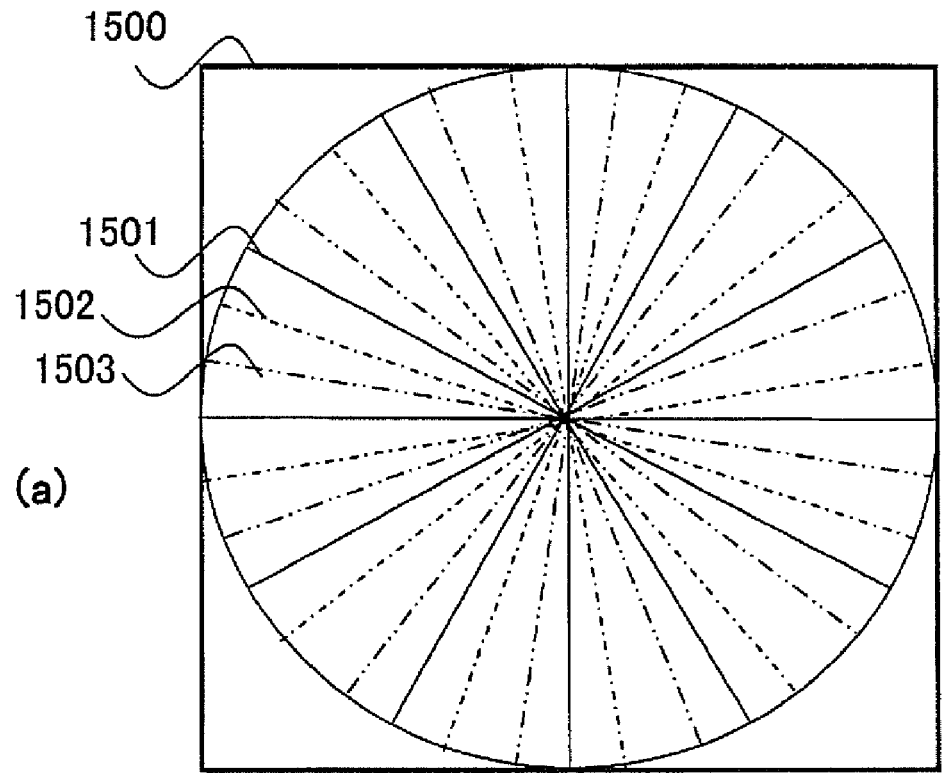
(a)
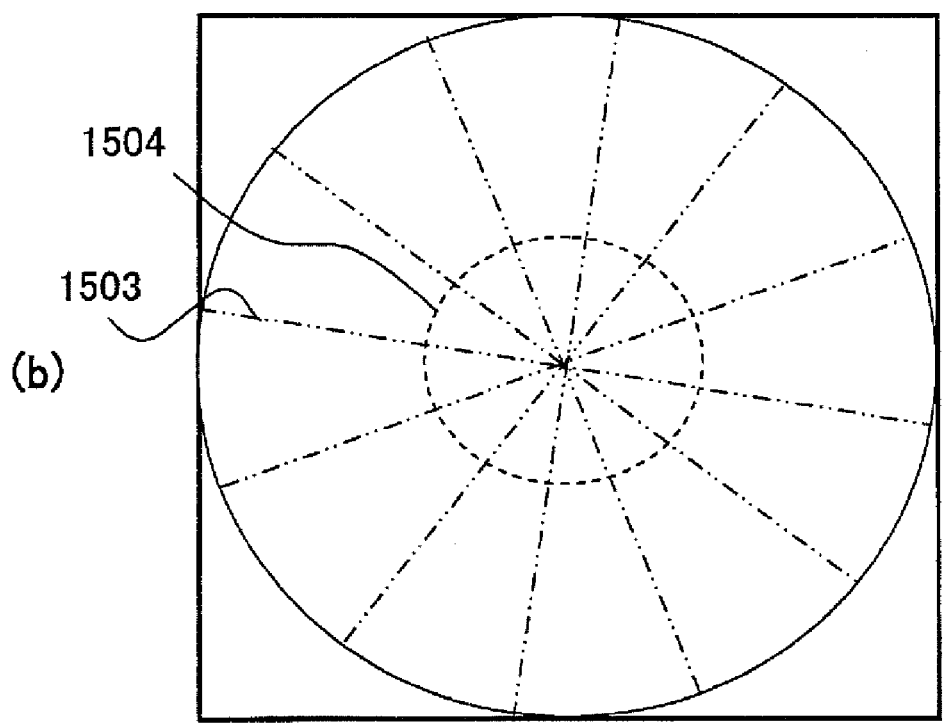
(b)

FIG.14
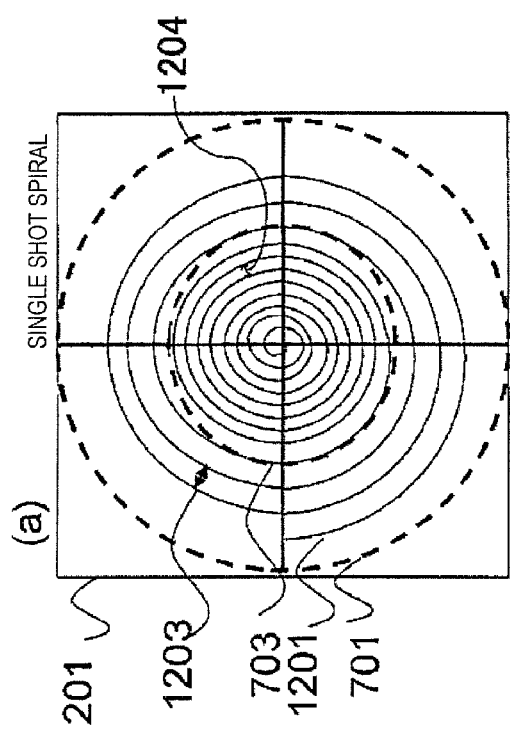
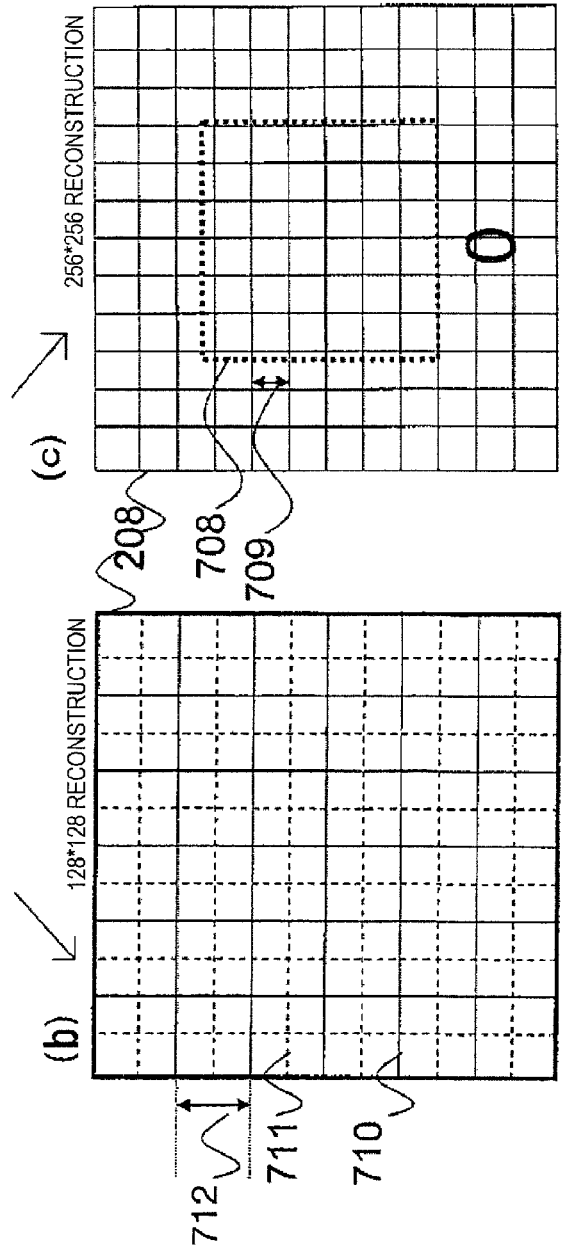

PARALLEL IMAGING IN NON-CARTESIAN MAGNETIC RESONANCE IMAGING (MRI) AND MRI APPARATUS REALIZING THE SAME

TECHNICAL FIELD

This disclosure relates to a magnetic resonance imaging (MRI) apparatus that continuously measures nuclear magnetic resonance (hereinafter, referred to as "NMR") signals from hydrogen, phosphorus and others in a subject and visualizes the distribution of nuclear density, distribution of relaxation time and so forth. More particularly, it relates to a parallel MRI that obtains an image with a wide field of view and without aliasing by means of operation using signals received by a multiple coil composed of multiple receiver coils.

BACKGROUND

Recently, in NMR, high-sensitive coils composed of multiple relatively high sensitive element RF coils that are called multiple or phased array coil (hereinafter, referred to as multiple coil) are in heavy usage as an RF coil receiving NMR signals. They can have a larger field of view (FOV) while keeping high sensitivity of element RF coil, and achieve higher sensitivity by synthesizing signals received by each element RF coil.

There is a method for shortening imaging time by the use of reduced number of measurement data by using such multiple coils. This method is called space encoding, parallel imaging or parallel MRI method, and is referred to as "parallel MRI" in this specification. In the parallel MRI, imaging is performed by reducing (thinning) the number of data in the phase encoding direction. And aliasing in image, which is generated due to the thinning of phase encoding data, can be prevented by using a sensitivity distribution of element RF coils different spatially from each other. The prevention of aliasing requires operation using a sensitivity distribution of high-precision RF coil. There are two methods, SMASH method and SENSE method. The SMASH method performs the operation in measurement space (k-space) and complements thinned out data by interpolation, while the SENSE method removes aliasing by performing the operation in a real space after Fourier transform.

As an MRI imaging methods, there is a method called Cartesian imaging, in which at the sampling of echo signals on the measurement space (namely the space called k-space) the sampling parallel to the frequency encoding direction (Kx axis on the k-space) is repeated along the phase encoding direction (Ky axis on the k-space). In Cartesian imaging, each sampling point is an orthogonal grid point that is intersection between the group of equally spaced lines parallel to the Kx axis and the group of equally spaced lines parallel to the Ky axis.

However, in the Cartesian imaging, when a subject is in motion while imaging is performed, such motion may exert an influence on the entire image and cause an artifact (hereinafter, referred to as "motion artifact"), which looks like a flowing of an image in the phase encoding direction. As an imaging method capable of preventing such artifacts, the method called non-Cartesian imaging is now under development for practical application. One of the typical non-Cartesian imaging methods is a radial scan or spiral scan. Since these non-Cartesian imaging methods radially scan the k-space, they sample the data on points (non-orthogonal grid points) other than orthogonal grid points that are sampling points in the above-mentioned Cartesian imaging.

There has been proposed to further speed-up such non-Cartesian imaging by applying the above-mentioned parallel MRI while preventing the occurrence of motion artifacts (Non-patent Document 1, Non-patent Document 2 and Patent Document 1). In non-Cartesian imaging, the artifacts produced when the data is roughly obtained by applying parallel MRI are more complicated than those produced in Cartesian imaging. In the SENSE method, these artifacts can be prevented by using a generalized parallel method.

As the generalized parallel method performs operations by assuming that aliasing artifacts enter into each point from all points (all pixels except itself) in a real space, it takes longer time to operate an increased amount of computation. Consequently, the generalized parallel method has disadvantages such as difficulty in high speed computation and lower practicality as it needs to compute a larger amount of computation, including recursive processing. In view of these, the SMASH method is now a mainstream of non-Cartesian parallel MRI presented at the ISMRM.

[Non-Patent Document 1]
K P. Pruessmann et al (3). "Advances in sensitivity encoding with arbitrary k-space trajectories" Magnetic Resonance in Medicine 46, p. 638-651, (2001)
[Non-Patent Document 2]
E N. Yeh, et al (8), "Inherently self-calibrating non-Cartesian parallel imaging" Magnetic Resonance in Medicine 54, p. 1-8, (2005)
[Patent Document 1]
Japan Published unexamined patents application No. 2004-344183

BRIEF SUMMARY

In an aspect of this disclosure, there is provided a new operation technique to be used in the SENSE method for applying parallel MRI to the non-Cartesian imaging, that is, technology enabling the performance of high speed operation by using a small amount of computation for removing aliasing in a real space for the data measured by the non-Cartesian imaging.

In another aspect, there is provided an MRI apparatus comprising; multiple receiver coils each having a sensitivity distribution data different from each other, a measurement control means for performing measurement of data on trajectory of a k-space, at least a part of the trajectory being non-parallel to the axis of the k-space, and for obtaining a first k-space data for each receiver coil, and an image reconstructing means for obtaining a target image using the first k-space data and the sensitivity distribution data of each receiver coil by applying an operation based on parallel imaging, wherein the image reconstructing means obtains a second k-space data by reallocating at least a part of the first k-space data on s of the k-space, and obtains the target image by performing the operation based on parallel imaging using the second k-space data and the sensitivity distribution data of each receiver coil; and characterized in that the orthogonal grid points of the k-space, on which at least a part of the first k-space data is reallocated, corresponds to a field of view narrower than that of the target image.

Further, the MRI apparatus is characterized in that the image reconstructing means obtains a third k-space data, for each receiver coil, by reallocating a part of the first k-space data on orthogonal grid points having a field of view equal to that of the target image and a spatial resolution lower than that of the target image, and obtains the sensitivity distribution data using the third k-space data.

In another aspect of this disclosure, there is provided an MRI method for imaging a subject using multiple coils each having a different sensitivity distribution so as to obtain a target image of the subject, comprising; a step of acquiring a first k-space data, for each receiver coil, by measuring data on a trajectory, at least part of which is non-parallel to the axis of a k-space, a step of obtaining a second k-space data, for each receiver coil, by reallocating at least a part of the first k-space data on orthogonal grid points of the k-space, which corresponds to a field of view narrower than that of the target image, and a step of performing an operation based on parallel imaging by using the second k-space data and the sensitivity data of each receiver coil to obtain the target image; and characterized in that the orthogonal grid points of the k-space, on which at least a part of the first k-space data is reallocated, corresponds to a field of view narrower than that of the target image.

In addition, the above-mentioned MRI method is characterized in that it further comprises a step of obtaining a third k-space data, for each receiver coil, by reallocating a part of the first k-space data on orthogonal grid points of the k-space having a field of view equal to that of the target image and a spatial resolution lower than that of the target image, and obtaining the sensitivity distribution data using the third k-space data.

In typical non-Cartesian data sampling epitomized by radial sampling, data sampling in the outermost part of the k-space tends to be sparse in a radial direction. In order to prevent the occurrence of reconstruction artifacts, therefore, the number of radial scanning lines needs to be at least approximately 0.6 times more ($256 \times 1.6 \approx 404$) than the number of Fourier transform points (for example, $256 \times 256$). If the number of radial scanning lines is less than the number (404), radial artifacts may appear. When the parallel MRI is applied to the non-Cartesian data sampling with a purpose to reduce the number of measurements, a generalized SEMSE method as described in Non-patent Document 1 needs to be applied to remove such radial artifacts.

On the other hand, in the approach of this disclosure, the artifacts appearing due to sparse data sampling specific to the non-Cartesian imaging is prevented by narrowing the field of view in the reconstruction on the orthogonal coordinate when the non-Cartesian data is converted to the orthogonal data by gridding. The aliasing of image, which may be contained in the orthogonal data due to a narrowed field of view, is removed by the parallel MRI operation in the conventional Cartesian imaging.

Thus, an operation method capable of high-speed parallel MRI in Cartesian imaging for non-Cartesian imaging sequence can be provided to make the application of parallel MRI to the non-Cartesian imaging sequences easier. As a result, in the devices equipped with the Cartesian imaging sequence of SMASH or SENSE method, practical non-Cartesian imaging sequence can be applied without developing non-Cartesian type having different methods of operation.

BRIEF DESCRIPTION OF THE DRAWINGS

FIG. 13: A diagram explaining imaging reconstruction in the fifth embodiment.

FIG. 14: A diagram explaining imaging reconstruction in the third embodiment.

BEST MODE FOR CARRYING OUT THE INVENTION

Embodiments of the present invention will be explained below with the reference to the attached drawings.

Figure 1:
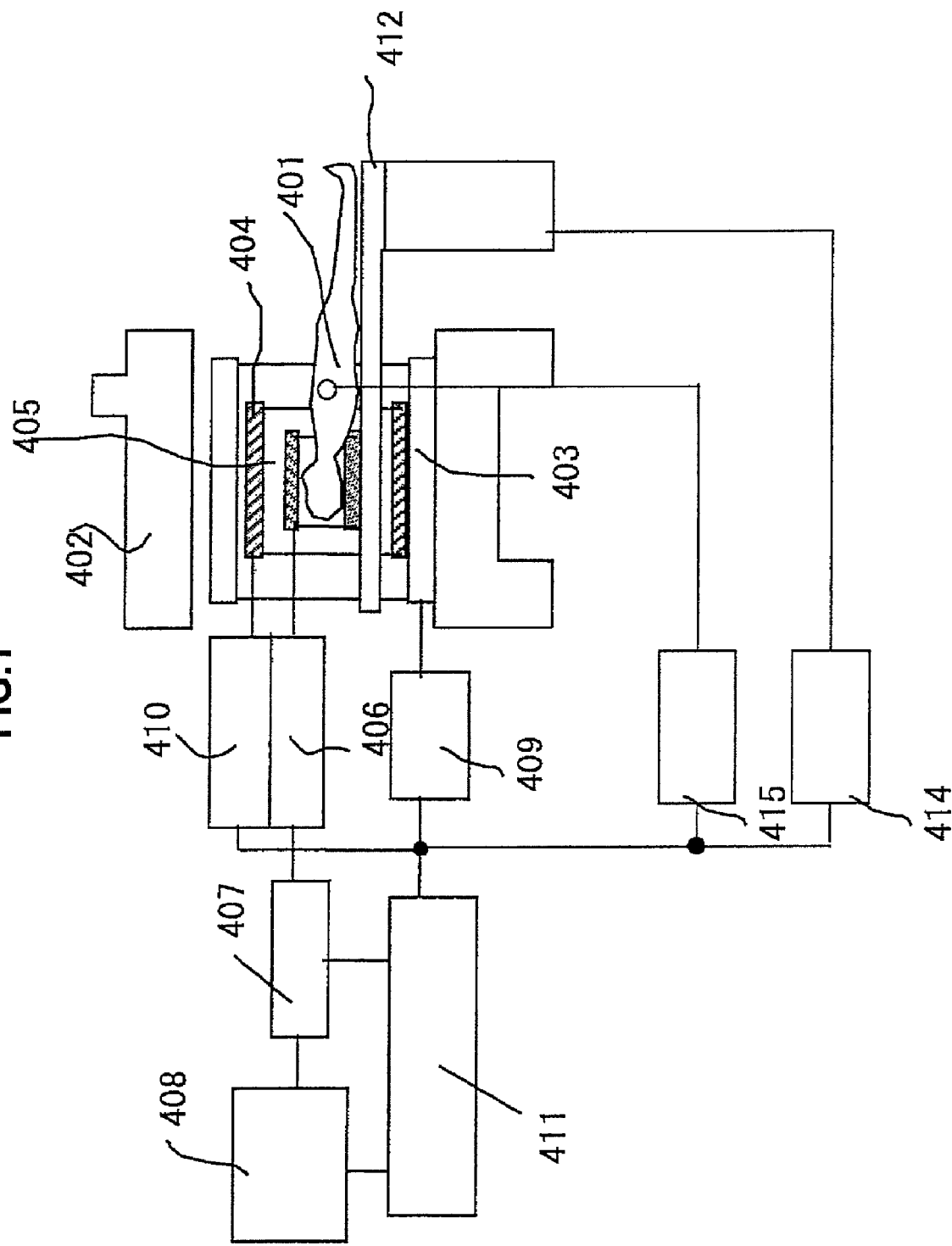
FIG. 1: A block diagram of MRI apparatus, to which the present invention is applied.

The configuration of a typical MRI apparatus in which the present invention is applied is explained with the reference to FIG. 1. This MRI apparatus comprises a magnet 402, which generates a static magnetic field, a gradient magnetic field coil 403, which generates a gradient magnetic field in the static magnetic field space generated by the magnet 402, an RF coil 404, which generates a high-frequency magnetic field in the imaging region of a subject 401 placed in the static magnetic field space and an RF coil (receiver coil) 405, which detects MR signals generated in the subject 401. The subject 401 is brought into the static magnetic field usually in a posture of lying on bed 412.

The gradient magnetic field coil 403 comprises gradient magnetic field coils in three directions, X, Y and Z, and generates a gradient magnetic field, respectively, in response to the signals emitted from the gradient magnetic field power supply 409. The RF coil 404 generates a high-frequency magnetic field in response to the signals from the RF transmission unit 410. The MRI apparatus according to the present embodiment is equipped with an RF coil 405, which comprises multiple high-sensitive element RF coils set in array. Signals received by the RF coil 405 are detected by the signal detecting unit 406, processed by the signal processing unit 407 and converted through computation to image signals. The image is displayed on a monitor 408.

Actions of the aforementioned gradient magnetic field power supply 409, the RF transmission unit 410 and the signal detection unit 406 are controlled by the control unit 411. A time chart for control is called a pulse sheet in general, and various pulse sequences which differ according to the imaging method are pre-stored in a memory device of the control unit 411. The MRI apparatus according to the present embodiment is equipped with a pulse sequence of non-Cartesian imaging, as detailed later, and performs the imaging sequence applying parallel MRI.

Figure 2:
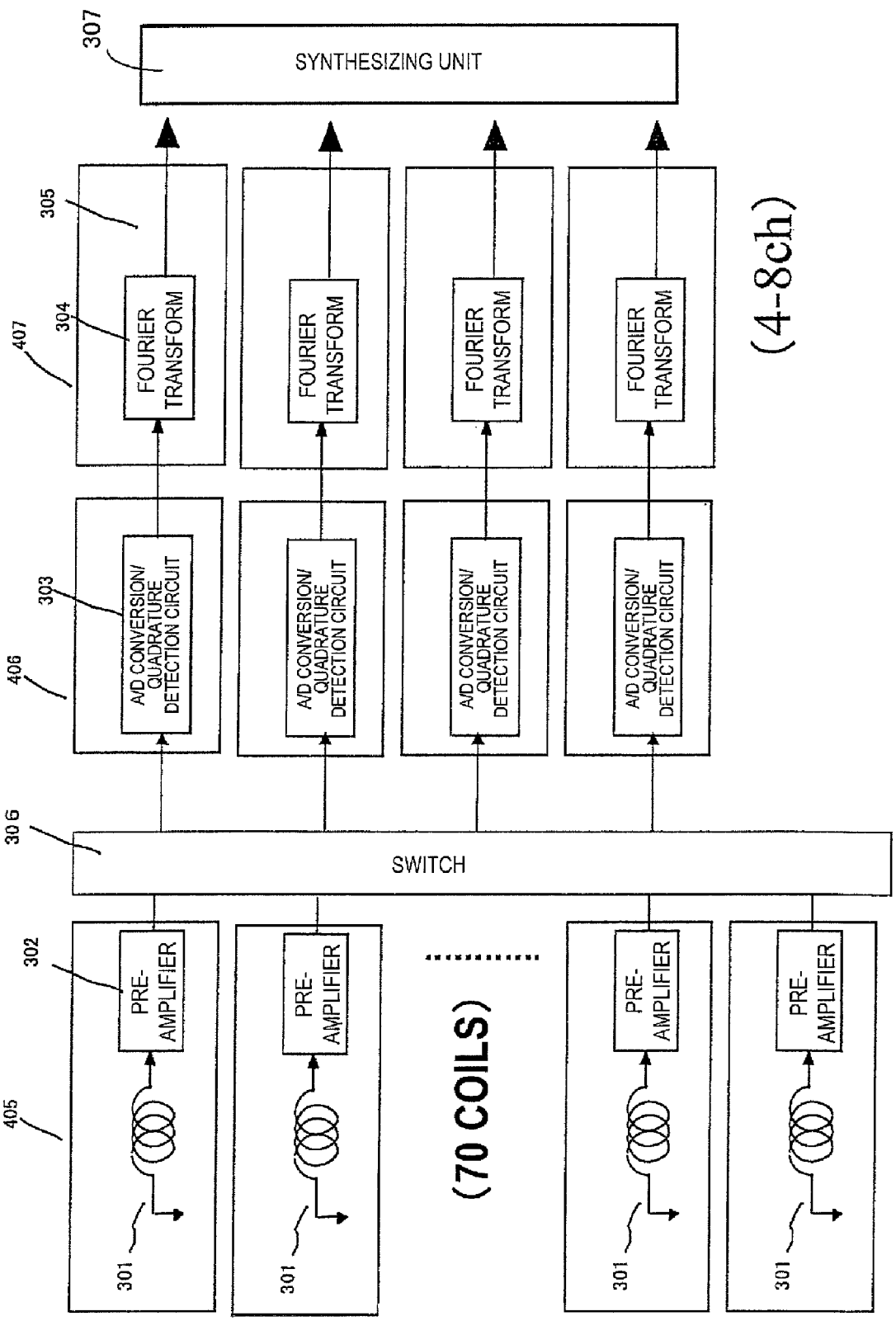
FIG. 2: A block diagram showing an example of detection unit and signal processing unit of the MRI apparatus shown in FIG. 1.

FIG. 2 shows an example of signal detection unit of the RF coil 405. The RF coil 405 is a multiple coil made of multiple element RF coils, and in the example shown in FIG. 2 one multiple coil is composed of 70 RF receiver coils 301, each being connected with a pre-amplifier 302. The signal detection unit 406 comprises 4 to 8 parallel A/D conversion/quadrature detection circuits 303, to each of which the output of each pre-amplifier of each RF receiver coil 301 is selectively connected via the switch 306. A signal processing unit 407 has an operation unit 305, which creates image data for each RF receiver coil 301 by applying operation such as Fourier transform and back projection to the digital signals A/D converted at each A/D conversion/quadrature detection circuit 303, a synthesizing unit 307 which synthesizes each image data and others.

Hereinafter, the action of the above mentioned MRI apparatus, particularly the embodiment regarding the image reconstruction by the operating unit 305 and the synthesizing unit 307, will be explained.

First Embodiment

Figure 3:
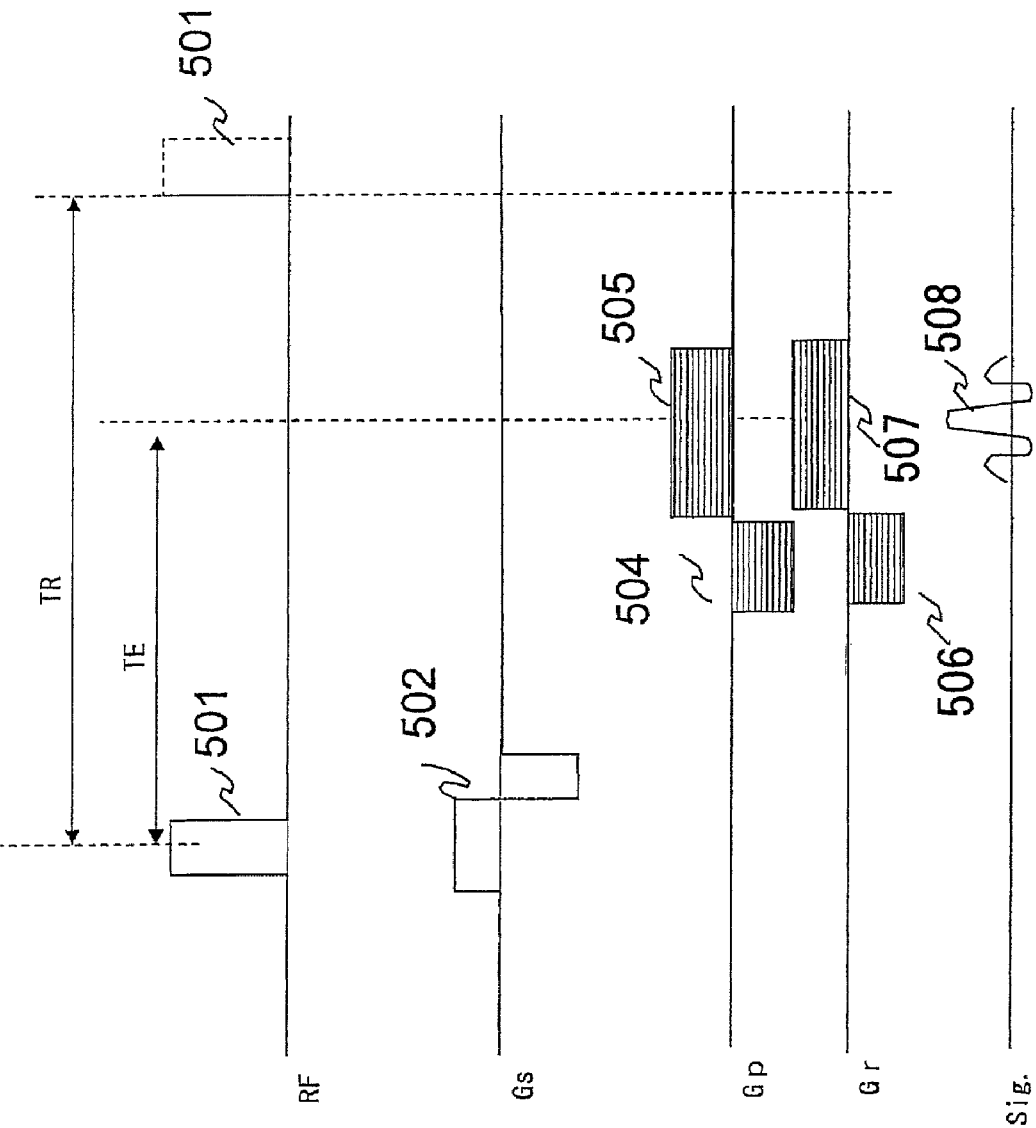
FIG. 3: A diagram showing an example of pulse sequence performed in the MRI apparatus of the present invention.

The imaging sequence equipped in the MRI apparatus will be explained first. According to the present embodiment a radial scan is applied as a pulse sequence of non-Cartesian imaging. FIG. 3 shows a typical 2D radial scan gradient echo (GrE) sequence, as an example of imaging sequence. In this imaging sequence, an RF pulse 501, which is to excite nuclear spins comprising the tissue of a subject (normally, proton), is applied together with a slice encoding gradient magnetic field pulse 502, and then pre-pulses 504 and 506 and the gradient magnetic field pulses 505 and 507 are applied in a direction of two axes (directions $G_1$ and $G_2$). Then, the measurement is performed on the gradient echo signal 508, which reaches peak when the absolute value of the applied amount of pre-pulses becomes equals to that of the gradient magnetic field pulse. Time from the excitation till the generation of echo signals, namely echo time TE is a parameter to determine image contrast and can be set arbitrarily according to the purpose of imaging.

Data made of one measured echo signal 508 is a line of data allocated on a k-space, which passes through an origin of the k-space and the angle of which with regard to the coordinate axis of the k-space is determined by the application amount of gradient magnetic field pulse along two axes (G1 and G2) and is called spoke (measured trajectory by radial scan; hereinafter referred to simply as trajectory). If the above mentioned step is repeated for 404 times, for example, while changing the application amount of gradient magnetic field pulses in the direction of two axes and the ratio between them every repletion time TR, data can be obtained while rotating on the k-space around an origin as a center. The time required for obtaining an image is calculated as follows:

[TR]×[No. of data sequences(no. of spokes)]

As it has been explained above, in the usual radial scan, the number of spokes should be 1.6 times more than the Fourier transform points to prevent the appearance of reconstructed artifacts. According to the present embodiment, in contrast, imaging time is shortened by applying parallel MRI and obtaining k-space data with less number of spokes.

Figure 4:
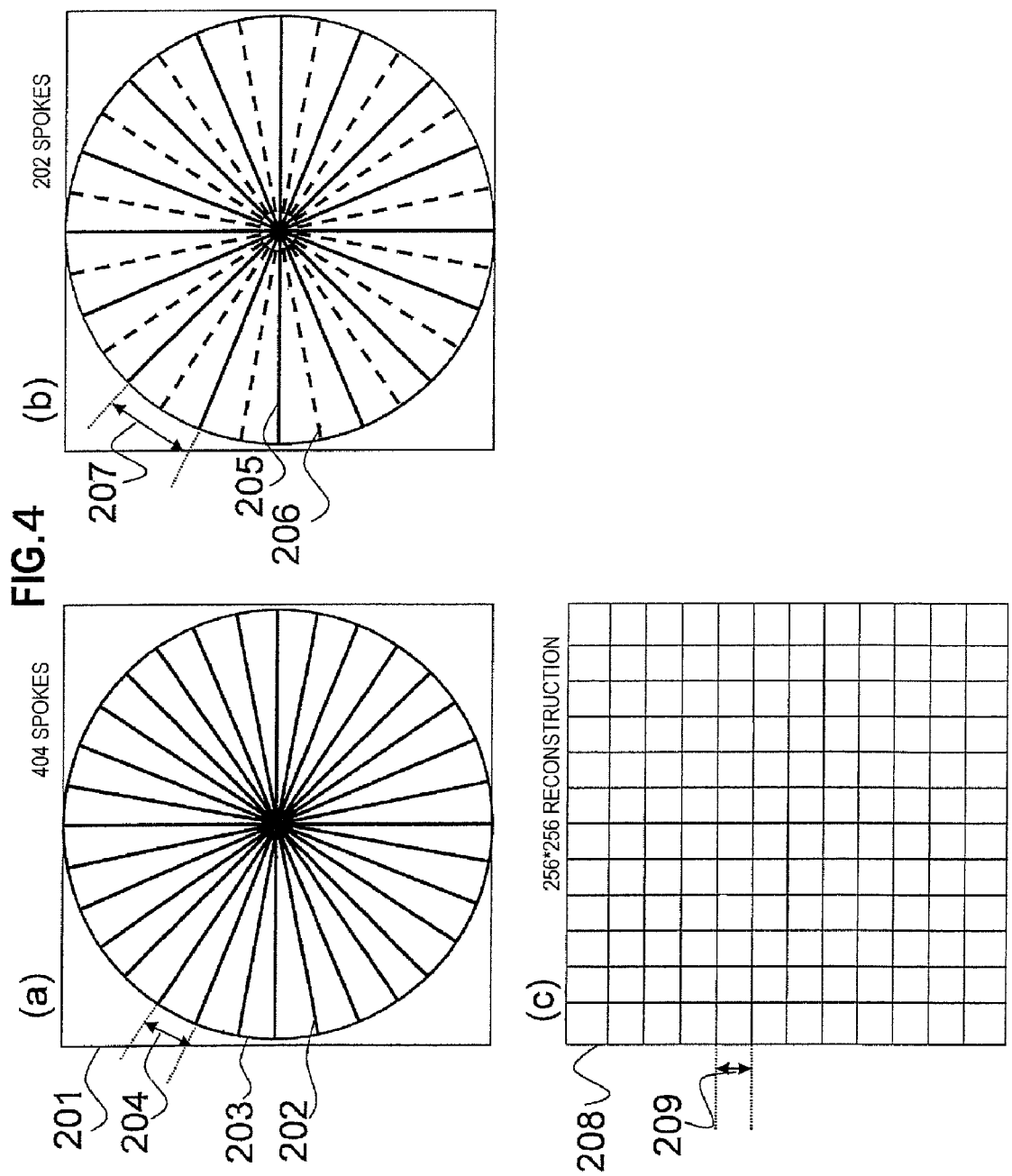
FIG. 4: A diagram explaining non-orthogonal data sampling in the conventional and the present invention.

Difference between the radial scan that applies parallel MRI according to the present embodiment and the usual radial scan is explained by using an example, in which 256× 256 points are subjected to the Fourier transform. FIGS. 4 (a) and (b) illustrate non-orthogonal data 201 obtained by radial scan. FIG. 4(a) shows trajectories of usual radial scan without applying parallel MRI, while Figure (b) shows trajectories according to the present embodiment. FIG. 4 (c) shows a Cartesian coordinate system (k-space) 208 on which gridding is performed. As illustrated, data can be collected only inside the circle 203 enclosing radial spokes 204 in the radial scan, and the space resolution is determined by the diameter of trajectory (diameter of the circle 203). Such data is converted by gridding to the data on the orthogonal grid points in the k-space having an equal spatial resolution. The gridding is a process to estimate data on the grid points from non-orthogonal data. More specifically, out of non-orthogonal data only the data within a certain distance from the grid point is subjected to weighted addition depending on the distance to create data on grid points. The data in the region outside the circle 203 is filled up with zero. For suppressing the occurrence of artifacts of radial scan, it is important to ensure that the grid pitch 209 is almost equal to or larger than the spacing of adjacent spokes (data trajectory) 204 on the circumference of the circle 203. This condition is met when a usual radial scan (a) consists of the number of spokes of 404 and the number of Fourier transform points is 256×256.

According to the present embodiment, on the other hand, as illustrated in FIG. 4(b), the number of spokes is reduced to one half of the number, for example, in usual case. Measured spokes 205 and unmeasured (or thinned out spokes) 206 are shown with a solid and dotted line, respectively. Imaging time, which is usually 4.04 seconds for the case with a typical TR of 10 ms and 404 spokes, can be shortened to 2.02 seconds with 202 spokes. However, the spacing of measured spokes 207 is two times larger than that of usual spokes 204. When this data is subjected to the Fourier transform, there appear artifacts of radial scan, which necessitates the generalized parallel method using the aforementioned SENSE method or the operation using the SMASH method. According to the present embodiment, by applying different gridding methods and using sensitivity distribution of each element coil in such image reconstruction of non-orthogonal data an image made by the synthesis of images of element coils can be obtained without causing artifacts of radial scan.

Figure 5:
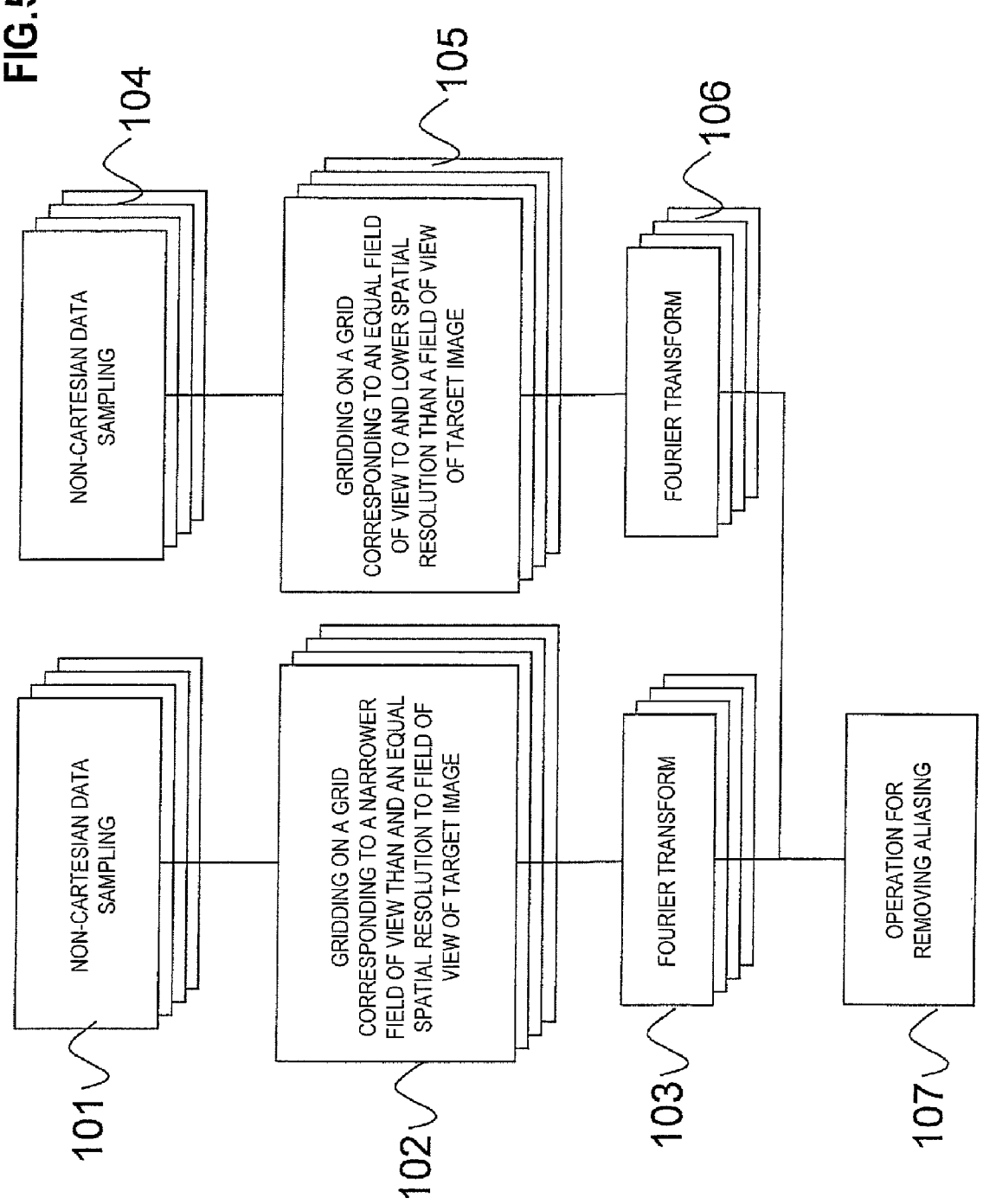
FIG. 5: A flow chart showing the first embodiment of image reconstruction of the present invention.

Hereinafter, the image reconstructing procedure will be explained. FIG. 5 shows an example of image reconstructing procedure. The figure shows the case that the signal detection unit 406 has four channels (the number of A/D conversion/quadrature detection in FIG. 3). In the illustrated case, in addition to the data obtained for constructing image for the subject, sensitivity distribution data is created by using a similar radial scan.

Image reconstruction comprises several processes such as measurement of non-orthogonal data for image (non-Cartesian data sampling) 101 by each receiver coil (channel), gridding of non-orthogonal data for image 102, Fourier transform 103, measurement of non-orthogonal data for sensitivity distribution (non-Cartesian data sampling) 104, gridding of non-orthogonal data for sensitivity distribution 105, Fourier transform 106 and operation 107 for removing aliasing by using the measurement data and sensitivity distribution at each receiver coil. Each processing is explained in detail below.

First of all, radial k-space data is obtained for each of the element RF coils composing a multiple coil by radial scan (non-orthogonal data sampling) (processing 101). This radial scan is the measurement of sparse or thinned spokes as shown in FIG. 4 (b), in which the spacing of adjacent spokes 207 on the circumference of the circle to which the spoke is circumscribed is larger than the grid pitch 209 of the k-space data for the reconstruction image. In the illustrated embodiment, for the purpose of simplifying explanation, the spacing 207 is two times larger than the pitch 209 but can be further wider depending on the number of element RF coils composing the multiple coil. In the four-channel configuration, the pitch can be widened up to 4 times larger. In other words, the data can be thinned out to one fourth.

Figure 6:
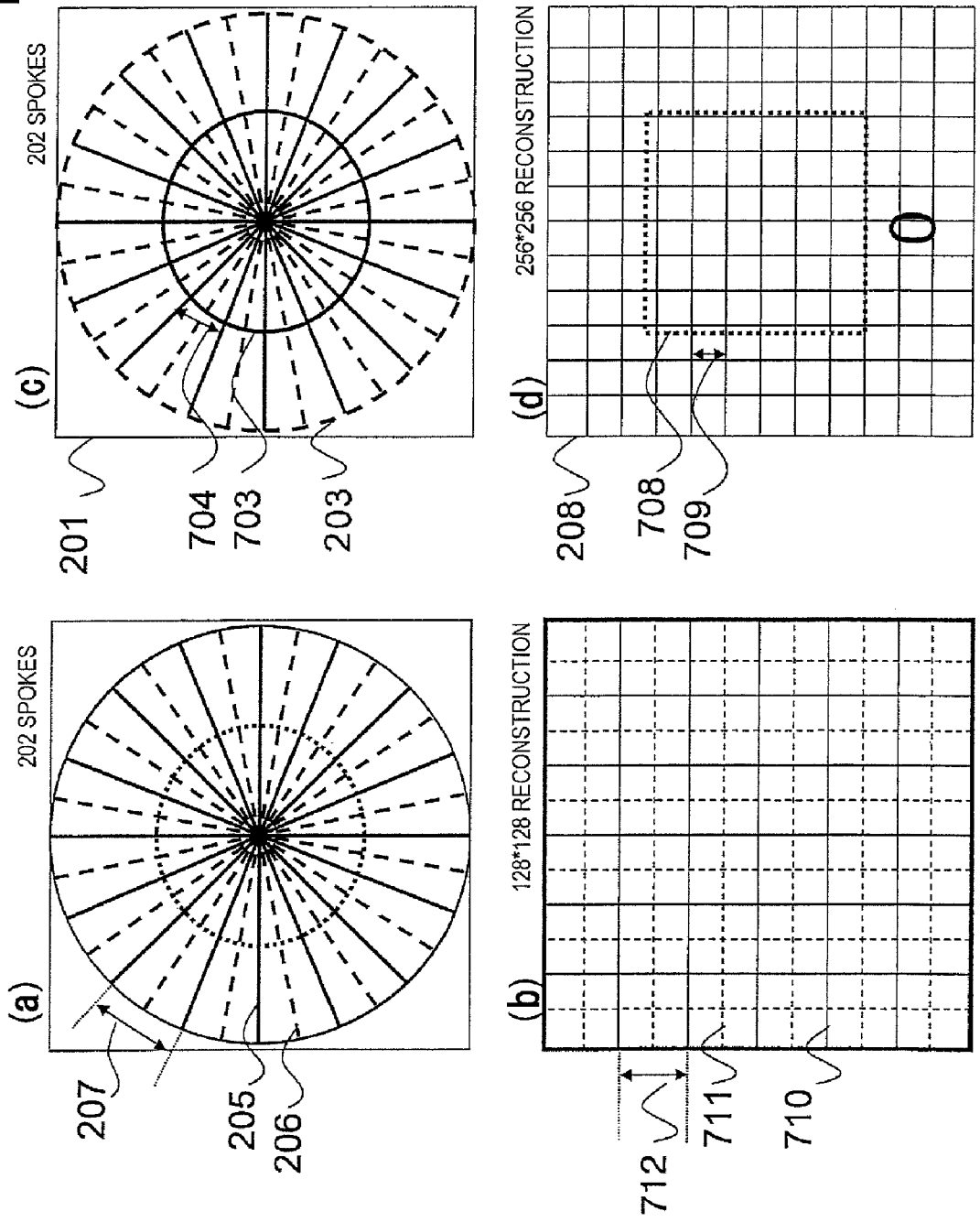
FIG. 6: A diagram explaining the image reconstruction in the first embodiment.

Then, the non-orthogonal data is subjected to gridding on the grid points of the Cartesian coordinate grid (processing 102) The gridding is performed on the grid having an equal spatial resolution to and a narrower field of view than that of the final image. FIGS. 6 (a) and (b) explain the gridding of non-orthogonal data for image. In the illustrated example, when the field of view of and the spatial resolution are set as 265 mm×256 mm and 1 mm, respectively, non-orthogonal data is gridded on the grid 710 having a field of view of 128 mm×128 mm in the processing 102. Although the number of lines is not described in FIG. 6 (b), the grid 710 shown with a solid line corresponds to the FOV of 128 mm×128 mm while the grid 711 containing a dotted line corresponds to the FOV of 256 mm×256 mm. The parts shown with a dotted line represent the part in which data is not allocated in the processing 102. Data thus allocated is two-dimensional on the Cartesian coordinate of 128×128. The processing 102 is applied to the non-orthogonal data of each channel to obtain two-dimensional data on the Cartesian coordinate by each channel.

Then, the two-dimensional data of each channel obtained by the processing 102 is subjected to the Fourier transform (processing 103). The Fourier transform 103 is a two-dimensional complex Fourier transform which converts a kx-ky space, for example, to an x-y space (real space). Since these two-dimensional data has a grid pitch 712 that is almost equal to the spacing of adjacent spokes of original non-orthogonal data, the two-dimensional complex Fourier transform does not cause artifacts attributable to the radial scan. Instead, since the grid pitch is enlarged, the field of view of the image after two-dimensional complex Fourier transform is reduced to a half in both horizontal and vertical directions, and therefore the image contains aliasing components.

FIG. 7(a) schematically illustrates an image with aliasing after the processing 102. In the Figure a subject is expressed with a symbol 601. In this case, since the field of view is gridded by reducing the field of view in both horizontal and vertical directions as shown in FIG. 6 (b), the aliasing image 602 in the horizontal direction and the aliasing image 603 in the vertical direction appear. Such aliasing components of image are removed, when the image is synthesized, by using sensitivity distribution of each element RF coil as will be mentioned later.

With regard to the sensitivity distribution of each element RF coil, radial k-space data is obtained (processing 104) as in the processing 101 for each element RF coil, which composes multiple coils, by means of radial scan (non-Cartesian data sampling). This non-Cartesian data sampling may be performed only for sensitivity distribution or as a pre-scan to determine requirements and parameters for the main measurement (measurement of non-orthogonal data to be used for image reconstruction) (processing 101).

Then, the non-orthogonal data is gridded on the grids (or grid point) of Cartesian coordinate (Processing 105). FIGS. 6 (c) and (d) explain the gridding of non-orthogonal data for sensitivity distribution. Unlike the processing 102, this processing 105 performs gridding on the grids having an equal field of view to and a lower spatial resolution than that of the final image. For example, if the field of view and the spatial resolution of the final image are 256 mm×256 mm and 1 mm, respectively, the field of view of the grids to be gridded and the spatial resolution are set as 256 mm×256 mm and 2 mm, respectively.

For this purpose, the processing 105 does not use all non-orthogonal data, but the data inside the circle 703 located in a certain distance from the original point of the k-space, as shown in FIG. 6 (c). The size of the circle 703 is determined as to make the spoke spacing on the circumference 704 equals or smaller than the grid pitch 709 shown in FIG. 6(d). Gridding of the data inside the circle 703 produces orthogonal data of rectangular low frequency region 708 of k-space, as shown in FIG. 6(d).

After filling the k-space with 0 in the grid intersection outside the region 708, two-dimensional Fourier transform is performed (processing 106). It is preferable to place, prior to the Fourier transform, an appropriate filter such as Gauss filter and Hanning filter, on the border between the region 708 and the zero-filled region. This may suppress the appearance of truncation artifacts after Fourier transform by smoothly connecting absolute values of data in the boundary region. Complex image obtained by the processing 106 is an image having a large field of view containing low frequency components. Cut-off of low frequency components is determined by the area of the region 708, while the field of view is determined by the grid pitch 709. In the case shown in FIG. 6 (d), an image with an equal field of view, 256 mm×256 mm, to that of final image is obtained. This image represents virtually the sensitivity distribution of each element RF coil.

Finally, the image data obtained for each element RF coil by the processing 103 is synthesized by using sensitivity distribution obtained by the processing 106 (processing 107). Since the image data used for the synthesizing operation is obtained by the Fourier transform of orthogonal data without containing artifacts of radial scan, the operation for removing aliasing by using the SNESE method can be applied as described below.

In one dimensional parallel MRI, in which the number of measurement data is thinned out on either vertical or horizontal direction of aliasing components, when the sensitivity image and the signal value of the image data obtained for each element RF coil are expressed as Ci (x,y) (i=1, 2, . . . N: N is the coil number. same below) and Si (x, y), respectively, the signal value Si(x,y) can be expressed by the product of sensitivity distribution of receiver coil, Ci(x,y), and the proton density distribution of a subject, P(x, y). However, here, the number of grids in the narrow field of view, Y', is expressed with Y'=Y/M, where the number of pixels of the final image is Y, and the thinning rate (acceleration factor) is M, and the pixel value S'I (x,y) of the image is expressed by the formula (1).

[Formula 1]

$$S'i(x, y) = \frac{1}{a} \sum_{j=1}^{M} Cij \times Pj \quad (1)$$

$$Cij = Ci(x, y' + (j-1) \times Y')$$
$$Pj = P(x, y' + (j-1) \times Y')$$

Since Cij can be expressed with the matrix of M (rows) and N (columns) as shown in Formula (2), the signals deprived of aliasing are obtained as an image by computing this inverse matrix.

[Formula 2]

$$C_{ij} = \begin{bmatrix} C_{11} & C_{12} & \cdots & C_{1M} \\ C_{21} & C_{22} & \cdots & C_{2M} \\ \vdots & \vdots & \ddots & \vdots \\ C_{N1} & C_{N2} & \cdots & C_{NM} \end{bmatrix} \quad (2)$$

In the two dimensional parallel MRI in which the numbers of measurement data are thinned on each vertical and horizontal direction as in this embodiment, the matrix operation to compute its proton density distribution (image after expansion) P can be expressed by the following formula (3), as the case of above mentioned one dimensional MRI.

$$P = (S^T S)^{-1} S^T I \quad (3)$$

where, I is an aliasing image and S is an expansion matrix and expressed by the following formula (4).

[Formula 3]

$$S = \begin{bmatrix} b_{(1)}(x, y, z), b_{(1)}(x + p\Delta x, y, z + q\Delta z), \\ b_{(1)}(x + p\Delta x, y, z).b_{(1)}(x, y, z + q\Delta z) \\ b_{(2)}(x, y, z), b_{(2)}(x + p\Delta x, y, z + q\Delta z), \\ b_{(2)}(x + p\Delta x, y, z).b_{(2)}(x, y, z + q\Delta z) \\ \ldots \\ b_{(N)}(x, y, z), b_{(N)}(x + p\Delta x, y, z + q\Delta z), \\ b_{(N)}(x + p\Delta x, y, z).b_{(N)}(x, y, z + q\Delta z) \end{bmatrix} \quad (4)$$

where $b_{(N)}$ is the sensitivity of coil with the channel number N, ( ) is the location, $\Delta x$, $\Delta y$ and $\Delta z$ are the size of field of view of the final image on x-, y- and z-direction, respectively, p is the reciprocal number of acceleration factor on an x-direction, and q is the reciprocal number of multiplication on an z-direction.

As explained above, the MRI apparatus according to the present embodiment comprises multiple receiver coils 405, each having a sensitivity distribution different from each other, a control unit 411, which obtains a first k-space data of each receiver coil 405 by measuring data on trajectories of the k-space, at least a part of the trajectories being non-parallel to the axis of the k-space, and a signal processing unit 407, which obtains a target image by using the first k-space data and the sensitivity distribution data of each receiver coil 405 and applying an operation based on a parallel imaging, wherein the signal processing unit 407 obtains a second k-space data by reallocating at least a part of the first k-space data of each receiver coil 405 on the orthogonal grid points of the k-space having a narrower field of view than that of the target image and obtains a target image by performing an operation based on a parallel MRI using the second k-space data and the sensitivity distribution data of each receiver coil 405.

The orthogonal grid points of the k-space on which at least a part of the first k-space data is reallocated have an equal spatial resolution to that of the target image.

The signal processing unit 407 re-allocates, in two orthogonal directions, at least a part of the first k-space data on the orthogonal grid points of the k-space having a narrower field of view than that of the target image.

The control unit 411 set at least a part of the spacing of trajectories wider than the spacing corresponding to the field of view and the spatial resolution of the target image, and measures data on the trajectories, whose spacing is thus set wider. The signal processing unit 407 controls the pitch of orthogonal grid points on which the first k-space data is re-allocated in accordance with the spacing of data-measured trajectories. The trajectory consists of multiple radial trajectories with different angles with regard to an origin of the k-space.

The signal processing unit 407 performs the processing, as an operation based on the parallel imaging, to obtain an image with aliasing by subjecting the second k-space to Fourier transform by each receiver coil 405, and obtain a target image by using the aliased image and sensitivity distribution data of each receiver coil 405.

The MRI apparatus according to the present embodiment provides a magnetic resonance imaging method, which performs imaging of a subject by using multiple receiver coils 405 having a different sensitivity distribution from each other and obtains a target image for the said subject, and is characterized in that the magnetic resonance imaging method comprises a step for obtaining the first k-space data by each receiver coil 405 by measuring data on trajectories of a k-space, at least a part of the trajectories being non-parallel to the axis of the k-space, a step for obtaining the second k-space data by re-allocating at least a part of the first k-space data for each receiver coil 405 on the orthogonal grid points of the k-space having a narrower field of view than that of the target image, and a step for obtaining a target image by performing operation based on the parallel imaging using the second k-space data and the sensitivity distribution data of each receiver coil 405.

In the performance of the magnetic resonance imaging method, the orthogonal grid points of the k-space on which at least a part of the first k-space data is re-allocated have an equal spatial resolution to that of the target image.

The operation based on the parallel imaging using a magnetic resonance imaging method is the processing to obtain an image with aliasing by subjecting the second k-space data to Fourier transform by each receiver coil and to obtain a target image by the matrix operation using the aliased image and sensitivity distribution data of each receiver coil.

As has been explained above, according to the present embodiment, non-orthogonal data of radial scan obtained by thinning the data is subjected to the gridding on the grids having a larger grid pitch in a two-dimensional direction and having normal image aliasing elements so as to be transformed into orthogonal coordinate data having a normal image aliasing elements without including artifacts due to radial scan, and then the aliasing is removed by the known SENSE algorithm. Accordingly, the possible use of existing software and algorithm may enable a high-speed operation for removing aliasing.

As mentioned above, the generalized parallel method, one of the conventional technologies, performs the operation by assuming that aliasing artifacts may enter into each point from any points in a real space (all pixels other than itself), so it takes a longer time to calculate an increased amount of computational resources. For example, when the number of pixels on one side of the final image is N, its size will be N×N. In this case, aliasing from the pixel N×N−1 should be taken into account as an artifact overlapping a certain point. Here, N is a numerical figure, 256, for example.

On the other hand, according to the present embodiment, the data is substituted (transformed) by rough gridding, first of all, to make aliasing artifacts come only from limited pixels. In case of a parallel MRI image of multiple A speed, A×A−1 pixel should be taken into account as an origin (signal) of aliasing artifacts in the image after substitution. Here, A is a numerical figure, such as 2, for example. In comparison with the operation required by the conventional generalized parallel methods, therefore, the operating time will be (2×2−1)/(256×256−1), which is significantly shorter than the conventional operating time.

In respect of sensitivity distribution, by taking a part of narrowly spaced non-orthogonal data from radial scan data obtained similarly by thinning and gridding them on the grids with an equal field of view to that of the final image, image data representing practically the sensitivity distribution of coil can be obtained without introducing artifacts of radial scan. This sensitivity distribution is used in the operation for removing aliasing of the above mentioned SENSE algorithm.

In the above mentioned embodiment the processing 105 for creating orthogonal data, in which the outer circumference of the k-space without data is filled with zero, is explained. This is for the purpose to obtain a sensitivity map of low space frequencies, and as far as the similar sensitivity map can be obtained, the method is not limited to those described above. For example, after creating a smaller size (for example, 64×64) map by performing Fourier transform with a smaller number of matrices instead of zero-filling, the sensitivity map of the same size as a target image (for example, 256×256) may be created by applying interpolation on the real space (for example, spline interpolation). In this case, some additional processing can be performed to remove ringing artifacts, which appear when the Fourier transform is performed at low frequencies, by using low pass filters or the like. This will improve the accuracy of the sensitivity map.

Figure 8:
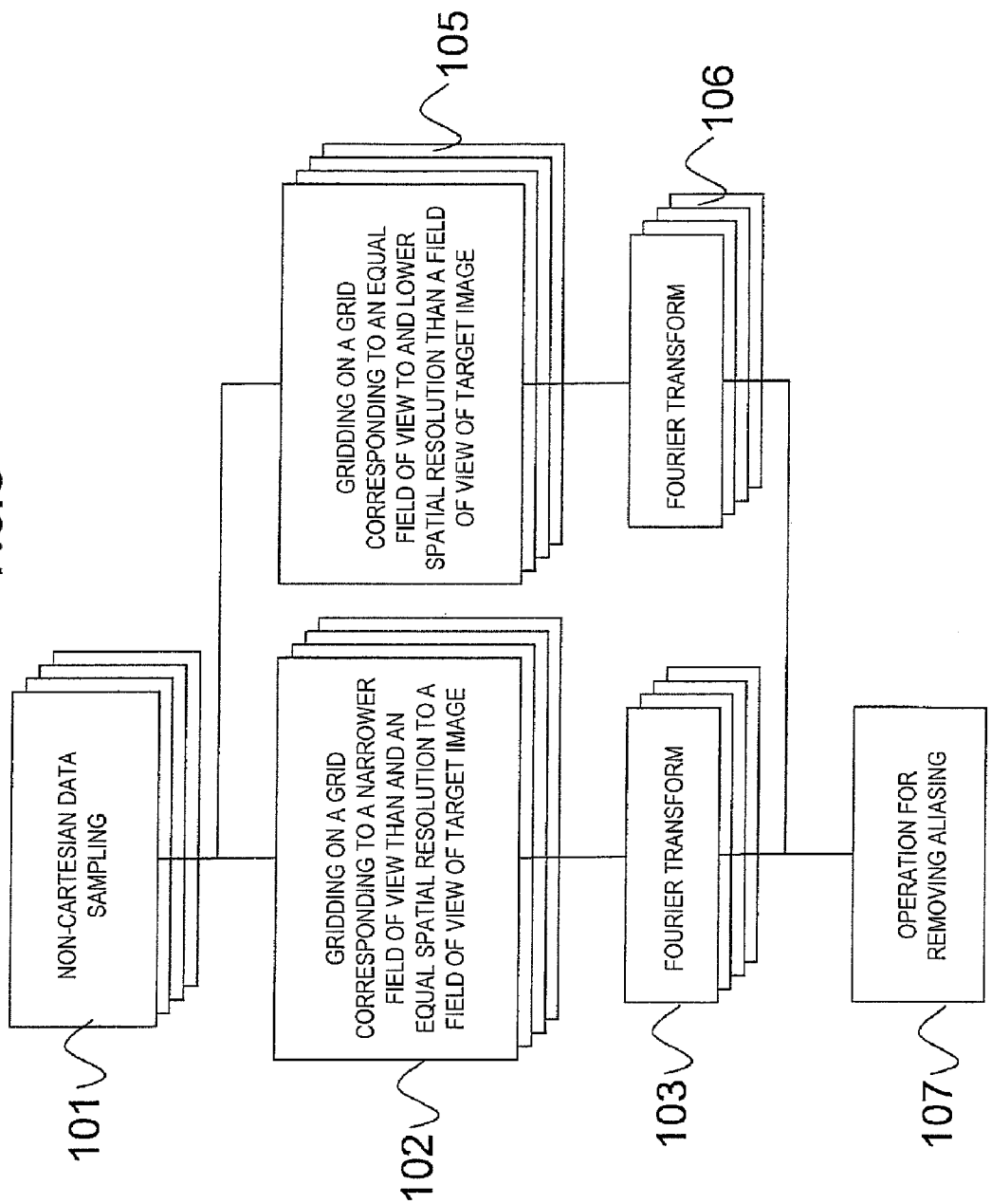
FIG. 8: A flow chart showing a variation of the first embodiment.

Also in the above-mentioned embodiment, the case in which non-orthogonal data for calculating sensitivity distribution data is measured independently from the main measurement (measurement of non-orthogonal data to be used for image reconstruction) is explained. However, as shown in FIG. 8, the sensitivity distribution data may be calculated by using non-orthogonal data of the main measurement. Image reconstruction in this case comprises the processes such as measurement of non-orthogonal data for image by each receiver coil (channel) 101, gridding of non-orthogonal data for image 102, Fourier transform 103, gridding of non-orthogonal data for sensitivity distribution 105, Fourier transform 106 and operation for removing aliasing by using measurement data and sensitivity distribution of each receiver coil 107. Details of each process are equivalent to those of the case in FIG. 5. However, the non-orthogonal data measured by the process 101 is used also in the calculation of a sensitivity distribution. In this case, the sensitivity distribution data responding to changes in status during main measurement is used, and because of so-to-speak self-calibration functions, parallel imaging can be performed in a stable manner even a subject moves.

Specifically, the signal processing unit 407 obtains third k-space data by re-allocating a part of the first k-space data by each receiver coil 405 on the orthogonal grid points of the k-space having an equal field of view to and lower spatial resolution than that of a target image, and obtains sensitivity distribution data by using the said third k-space data.

In this case, the signal processing unit 407 obtains the third k-space data by re-allocating the data near the origin in the first k-space data in proximity to the origin of the orthogonal grid point. Alternately, the third k-space data is obtained by re-allocating the data, which is inside the first k-space and in a dense data region and has a spacing equal to or smaller than the pitch of orthogonal grids in the k-space. Then, the signal processing unit 407 allocates zero on other orthogonal grid points in the third k-space data, which are different from the orthogonal grid points near the origin where the first k-space data is re-allocated.

The MRI apparatus according to the present embodiment also has a step to obtain the third k-space data by re-allocating a part of the first k-space data by each receiver coil 405 on the orthogonal grid points of the k-space having an equal field of view to and a lower spatial resolution than that of a target image, and to obtain sensitivity distribution data by using the said third k-space data.

Figure 9:
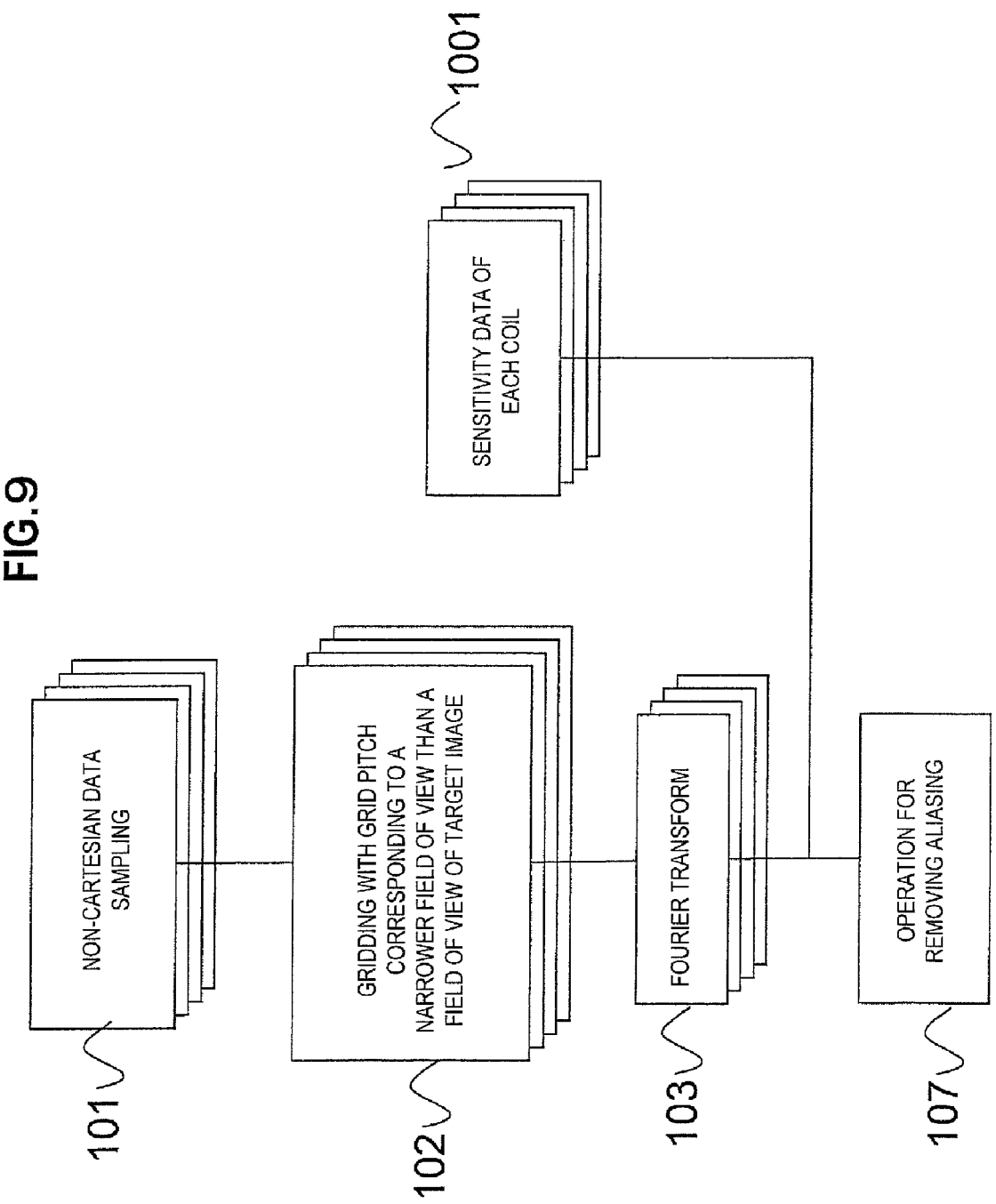
FIG. 9: A generalized flow chart of the first embodiment.

FIG. 9 shows an embodiment in which the production of sensitivity distribution data is generalized. Image reconstruction in this case comprises the processes such as measurement of non-orthogonal data for image by each receiver coil (channel) 101, gridding of non-orthogonal data for image 102, Fourier transform 103 and operation for removing aliasing by using measurement data and sensitivity distribution of each receiver coil 107. Details of each process are similar to those shown in FIG. 5. However, the means 1001 to obtain and create sensitivity distribution data used in the process 107 is not limited at all. For example, the sensitivity data can be obtained by pre-scan independently from the present measurement. In this case, the sensitivity distribution data can be produced without limitation to the non-orthogonal data sampling. For example, the sensitivity distribution data can be produced from the actually-measured data on the orthogonal coordinate system. This example has such advantage that the sensitivity distribution data can be shared by the orthogonal and non-Cartesian coordinate systems when the same site is clinically imaged in different pulse sequences.

Variations regarding the creation of sensitivity distribution data as explained above can be applied in a similar manner to every embodiment described below.

Second Embodiment

The procedure for image re-construction according to the second embodiment is equal to the procedure according to the first embodiment shown in FIG. 1. Namely, non-orthogonal data is sampled by radial scan in Step 101, the non-orthogonal data is gridded on the Cartesian coordinate having a narrower field of view than that of a final view in step 102, Fourier transform is performed in step 103 and the operation for removing aliasing is performed on the data in the real space by using a sensitivity distribution of each element coil in step 107. The coil sensitivity distribution is calculated from the non-orthogonal data at the steps 104-106.

Figure 10:
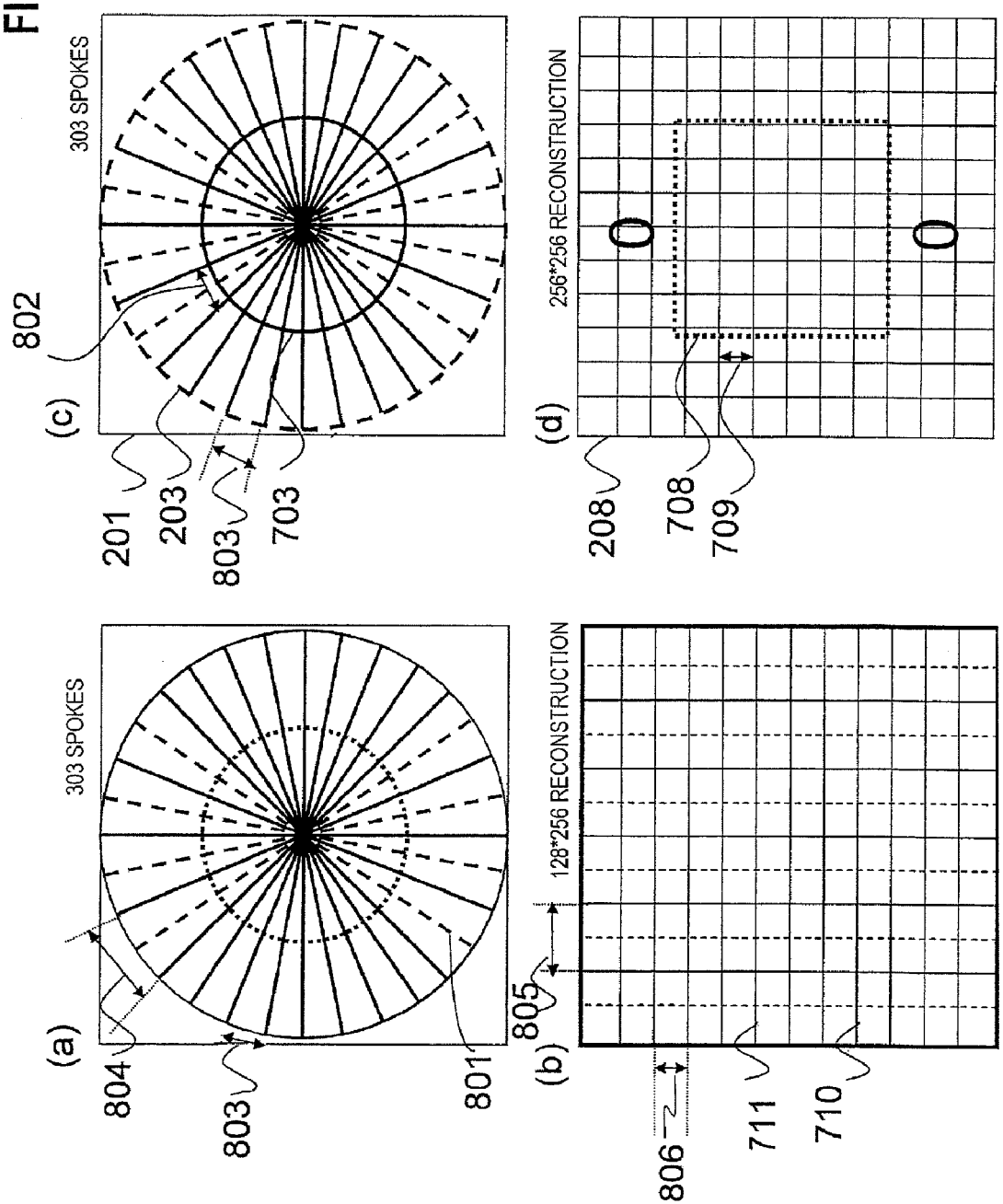
FIG. 10: A diagram explaining imaging reconstruction in the second embodiment.

However, according to the present embodiment, when non-orthogonal data is measured by thinning spokes, the thinning is carried out not at even rate but at uneven rate or with the thinning rate in a direction higher than in other direction. An example of non-Cartesian sampling according to the present embodiment is shown in FIG. 10. (a) and (b) in FIG. 10 explain non-orthogonal data sampling and gridding for main measurement, while (c) and (d) explain non-orthogonal data sampling and gridding for sensitivity distribution measurement. In (a) and (c), either the same data or separately obtained data may be used. Same symbols are used to denote same components between FIG. 10 and FIG. 6.

As illustrated, the measurement is performed by thinning by half for the region in a given angle (for example the region of 90 degree) with respect to the radial direction with a spoke parallel to the vertical direction (ky direction) as a center, but not thinning for spokes extending in the horizontal direction. The number of spokes to be measured is 303, for example. The spokes denoted by a dotted line in the Figure are thinned out spokes. Consequently, the spacing between spokes in a horizontal direction 803 is equivalent to that before thinning. Also, since the spokes in a vertical direction are thinned out, the distance of spacing between adjacent spokes 804 is twice the distance before thinning.

Then these data are gridded on the anisotropic grids, as shown in FIG. 10 (b). In respect of the anisotropic grids, the grid pitch in a vertical direction 806, for example, is equivalent to that of the final image and the grid pitch in a horizontal direction is twice the pitch in a vertical direction. For example, when the field of view and the spatial resolution of a final image are 256 mm×256 mm and 1 mm, respectively, the field of view and the space resolution of the grid to be gridded are 256 mm×128 mm and 1 mm×2 mm, respectively. Such anisotropic grids are used for the following reason. In respect of the non-orthogonal data shown in FIG. 10(*a*), in the high-frequency region of the k-space, data pitch in a horizontal direction is expanded because the spacing of adjacent spokes is nearly doubled, whereas adequate sampling density (data pitch) is kept in a vertical direction because the data pitch is determined by the data sampling interval on the spokes. In the medium to low frequency region in the k-space (central part of vertical direction), the data is densely sampled without thinning spoke in a horizontal direction. Consequently, the gridding using the anisotropic grid whose pitch in a horizontal direction is twice the pitch in a vertical direction means the gridding on the grids having a pitch almost equivalent to the largest pitch of non-orthogonal data in both vertical and horizontal directions, and can therewith prevent the occurrence of artifacts of radial scan.

Figure 7:
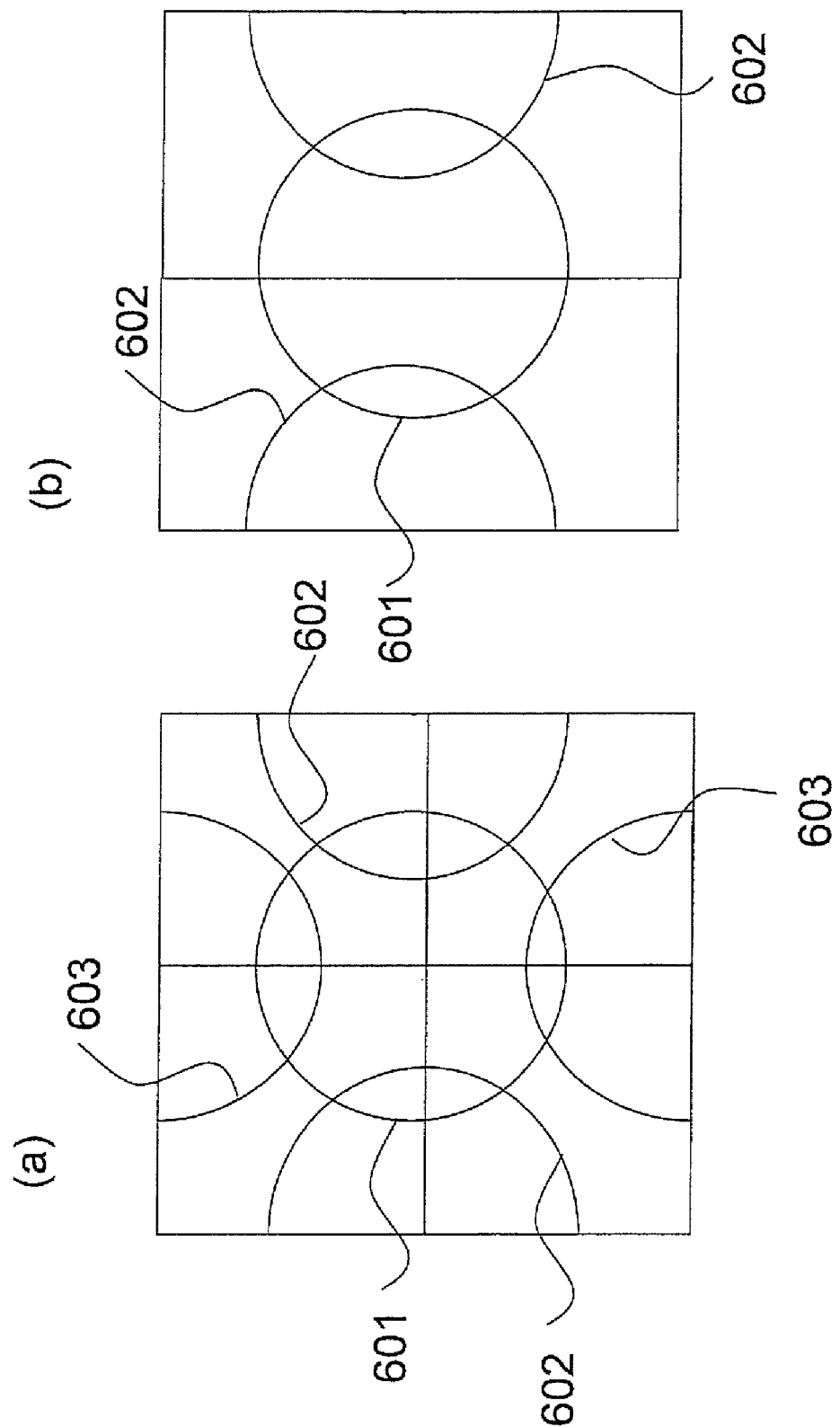
FIG. 7: A diagram explaining aliasing artifacts contained in image data.

When the k-space data gridded on such anisotropic grid is subjected to the two-dimensional Fourier transform, the resulting image 602 has aliasing in a horizontal direction but not in a vertical direction, as shown in FIG. 7(*b*). This aliasing can be removed by using a sensitivity distribution of each element coil composing a multiple coil (Step 107). The operation for removing aliasing by using a sensitive distribution can be performed as in the first embodiment.

Also in the present embodiment, the sensitivity distribution of coil can be calculated from the non-orthogonal data measured in or independently from the main measurement, or sensitivity distribution data can be obtained by pre-scan. Here, however, an example of procedure to obtain a coil sensitivity distribution by using non-orthogonal data as in the main measurement is explained with the reference to the FIGS. 10 (*c*) and (*d*).

FIG. 10 (*d*) shows the way how non-orthogonal data is gridded. The gridding method is principally equivalent to that of the first embodiment shown in FIG. 6. Namely, a region (enclosed by Circle 703) is selected so that the maximum spacing 802 of spokes thinned out in the vertical direction become equal to the grid pitch 709, and the non-orthogonal data in that region is subjected to isotropic gridding with the grid pitch 709 in the grid region 708 having an equal field of view to that of the final image. Zero (0) is set for other region. This data is subjected to two-dimensional Fourier transform of 256×256. Obtained image exhibits a low spatial resolution in a vertical direction but has no aliasing. Above-mentioned steps 104-106 are performed for each element coil, and the obtained image is set as sensitivity distribution data of each coil.

As explained above, the MRI apparatus according to the present invention is similar in principle to that according to the first embodiment. However, the signal processing unit 407 re-allocates at least a part of the first k-space data in either of two orthogonal directions on the orthogonal grid points in the k-space having a narrower field of view than that of the target image. In the present embodiment, the trajectories consist of multiple radial trajectories having different angles and starting from the origin of the k-space, and the signal processing 407 controls the trajectory spacing in a given direction to be wider than that in other direction.

According to the present embodiment, aliasing after the Fourier transform is equivalent to that of the parallel MRI of double speed in the vertical direction. By the reconstruction of image with the operation for removing aliasing using real space data (SENSE reconstruction), aliasing is removed. FIG. 10 illustrates the case in which the spoke spacing is changed dichotomously. However, as far as the conditions of gridding on the anisotropic grids are set to avoid the appearance of artifacts attributable to the non-Cartesian coordinate sequence, namely the relationship between grid pitch and non-orthogonal data pitch are set appropriately, the spacing of spokes can be changed in a variety of way, including sequential change.

The first and second embodiments have been explained above. In these embodiments, non-orthogonal data sampling is performed with two-dimensional radial scan, but the present invention can be applied to the three-dimensional radial scan. The explanation in FIG. 3 uses GrE sequence, while the SE sequence, balanced SG sequence and EPI sequence may be also employed. Moreover, the present invention can be applied to a dynamic scan which obtains time-series images by acquiring k-space data serially rather than only one image.

Hereinafter, other embodiments of the present invention, in which the present invention is applied to the pulse sequence performing non-orthogonal data sampling other than radial scan is explained. Abovementioned variations can be applied to the pulse sequence other than radial scan.

Third Embodiment

Figure 11:
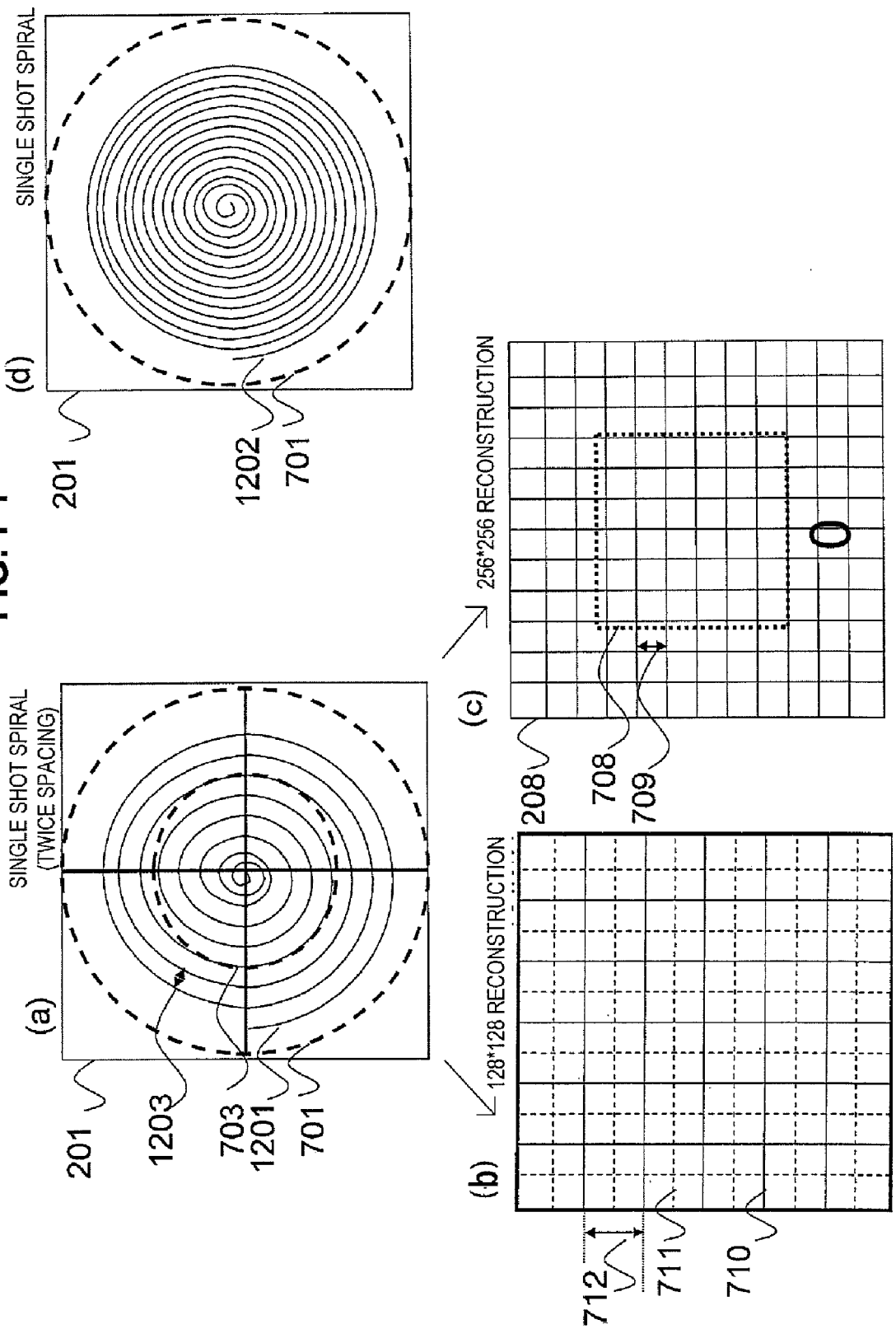
FIG. 11: A diagram explaining imaging reconstruction in the third embodiment.

This embodiment is different from the first and second embodiments in the point that non-orthogonal data is sampled using spiral scan but not radial scan. FIG. 11 (*a*) illustrates how the non-orthogonal data is measured by spiral scan, while FIGS. 11 (*b*) and (*c*) illustrate the way of gridding of non-orthogonal data. FIG. 11 (*d*) shows non-orthogonal data measured by conventional spiral scan. It shows an example of single shot spiral, in which all data in the k-space are measured by repeating inversion of the gradient magnetic field after one excitation.

The spiral scan performs a pulse sequence to measure echo signals for every cycle of sign curve by continuously applying gradient magnetic field as a sign curve with changing (increasing) amplitudes in two axial directions (phase encoding direction and read-out direction). This makes the trajectory in the k-space expand spirally outside the k-space from the origin of the k-space, as shown in FIG. 11 (*d*). Here, the pitch of spirals 120 is determined by the amount of area change of gradient magnetic field in two axial directions, and the spacings of adjacent trajectories near the origin and on the periphery are equal in the usual spiral scan. In order to suppress artifacts of spiral scan, it is important to make the spacing of spirals 1202 equal to or smaller than that of the final image matrix (spacing of k-space 709). The trajectory in FIG. 11 (*d*) and the reconstructed matrix of 256×256 meet these requirements. According to the present embodiment, on the contrary, the variation of the gradient magnetic field is set so that the spacing 1203 of spirals 1201 is double of the usual spacing 1202, for example, and non-orthogonal data as shown in FIG. 11 (*a*) is obtained.

These non-orthogonal data are subjected to the gridding on the grid corresponding to an expanded pitch of non-orthogonal data, as shown in FIG. 11(*b*). The pitch of the grid 712 is equal to or larger than the spacing of spirals of spiral scan. Namely, the gridding is performed on a grid having a narrower field of view than that of the final image and exhibiting spatial resolution (for example, 256×256) equal to that of the final image. The image obtained by performing two-dimensional Fourier transform on the orthogonal data obtained by such gridding contains aliasing components. Non-orthogonal data obtained by each element coil are subjected similar gridding and two-dimensional Fourier transform.

In creating a sensitivity distribution, of the non-orthogonal data obtained by the main measurement or independently, the data in the region enclosed by the circle 703 (low-frequency field) is selected and subjected, as shown in FIG. 11 (c), to the gridding in the region 708 of the corresponding grid. The size of the circle 703 is that the largest pitch of the data contained in the circle 703 is equivalent to or smaller than the grid pitch 709 of the region 708. This can suppress artifacts of spiral scan. The radius of this circle 703 is a half of the distance from the origin to the largest frequency. Zero (0) is set for other region of the grid 207, and after applying a filter as required, two-dimensional Fourier transform is performed. The image thus obtained is used as a sensitivity distribution of each coil.

When the non-orthogonal data obtained in the main measurement is also used for calculating a sensitivity distribution, the largest pitch of data inside the region (circle 703) from which the data to be used for the calculation of the sensitivity distribution should be smaller than the grid pitch 709. This will be achieved, for example, by setting variation of gradient magnetic field as to make the largest spacing of spirals 1201 contained in the circle 703 smaller than the pitch 709. In other words, as shown in FIG. 14(a), non-orthogonal data is obtained so that the spacing 1204 of spirals 1201 in the circle 703 becomes smaller or denser than that of the spacing 1203 of the spirals 1201 in the outer region.

The non-orthogonal data thus obtained as a whole is gridded on the grid corresponding to an expanded pitch of non-orthogonal data, as shown in FIG. 14 (b). The grid pitch 712 is equal to or smaller than the spacing of spirals of spiral scan. Namely, they are gridded on the grid having a narrower field of view than that of the final image and exhibiting spatial resolution (for example, 256×256) equal to the final image. The image obtained by performing two-dimensional Fourier transform to the orthogonal data obtained by such gridding contains aliasing elements. Non-orthogonal data acquired at each element coil is subjected to the similar gridding and two-dimensional Fourier transform.

In creating a sensitivity distribution, the data in the region enclosed by the circle 703 (low-frequency region) is selected out of the obtained non-orthogonal data and subjected, as shown in FIG. 14(c), to the gridding on the region 708 of the corresponding grid. The size of the circle 703 is as the largest pitch of spirals contained in the circle 703 is equal to or smaller than the grid pitches 709 of the region 708. This can suppress the occurrence of artifacts of spiral scan. Zero (0) is set for other region of the grid 207, and after applying a filter as may be necessary two-dimensional Fourier transform is performed. The image thus obtained is used as a sensitivity distribution of each coil.

When the non-orthogonal data acquired in the present measurement is used for calculating a sensitivity distribution, in order to make the largest pitch of the data inside the circle 703 smaller than the grid pitch 709, the interval of sampling of data inside the circle 703 can be denser rather than changing the spacing of spirals 1201, as mentioned above. Namely, it should be configured to ensure that the largest sampling interval does not exceed the interval 709.

Synthesis of aliasing-containing image data obtained for each coil by the aliasing removal operation using a sensitivity distribution of each coil is same with the first embodiment.

As described above, the MRI apparatus according to the present embodiment is principally the same as the first embodiment. However, the trajectory is a curvilinear trajectory expanding spirally from an origin of k-space as a starting point to a periphery of the k-space.

According to the present embodiment, by keeping the data sampling speed constant, the data acquisition time can be halved and the TR and TE shortened almost one half. In this case, the imaging speed is practically four times higher.

Fourth Embodiment

Figure 12:
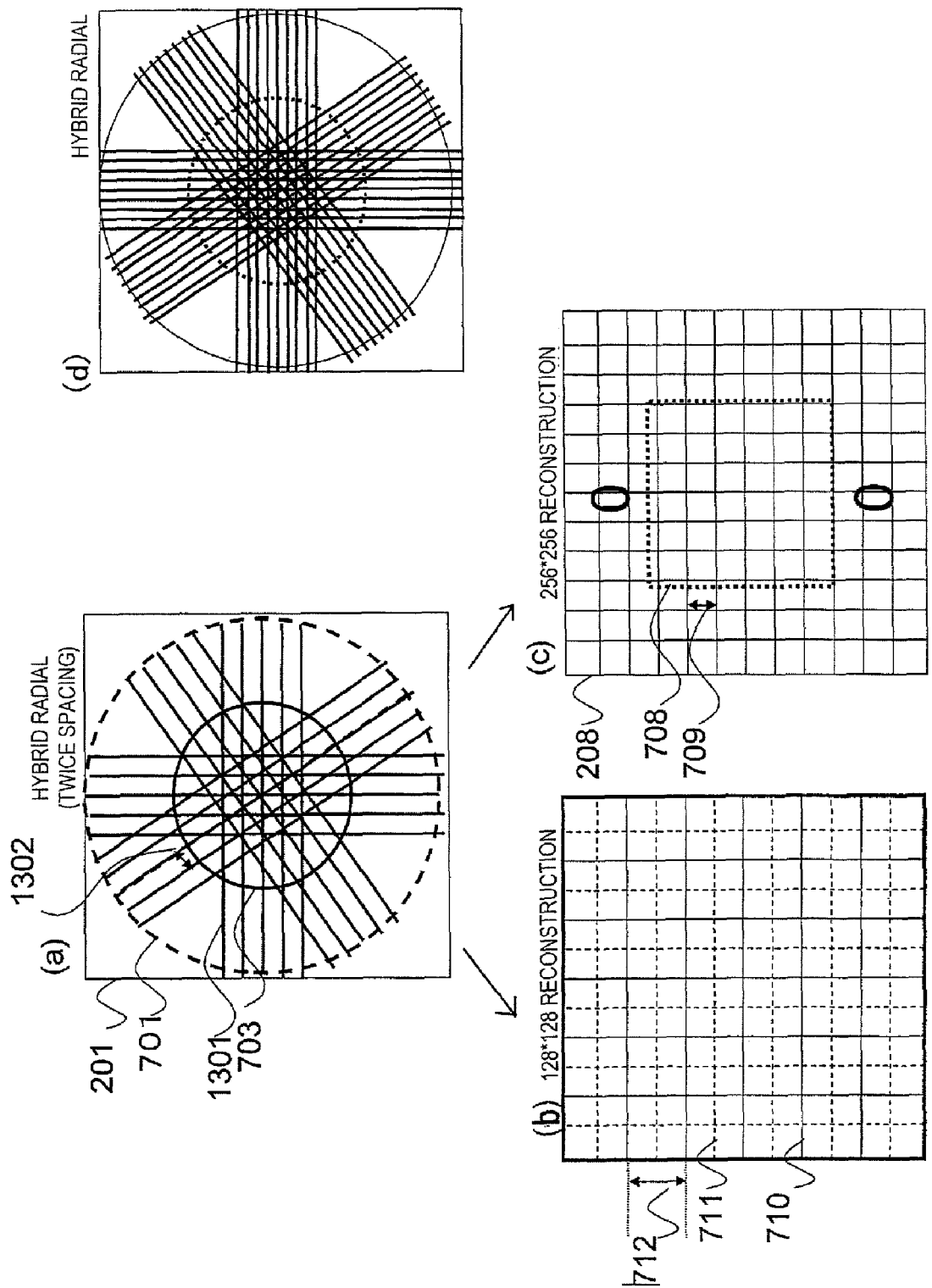
FIG. 12: A diagram explaining imaging reconstruction in the fourth embodiment.

The present embodiment is different from the first and second embodiments in the point that the non-orthogonal data is sampled by hybrid radial scan but not by radial scan. FIG. 12 (a) shows non-orthogonal data measured by the hybrid radial scan, while FIGS. 12 (b) and (c) show the way how the non-orthogonal data is gridded. Figure (d) shows the non-orthogonal data measured by the conventional hybrid radial scan.

There are different types of hybrid radial scan, including GR, SE and FSE types, to all of which the present invention is applicable. In the hybrid radial scan, as shown in FIGS. 12 (a) and (d), several blades 1301 consisting of a trajectory (equivalent to spoke) passing through an origin of the k-space and multiple trajectories parallel to the former trajectory are measured while changing an angle. The figure shows the example of 4 blades for the purpose of simplifying the explanation. According to the present embodiment, the measurement is performed with less number of trajectories comprising the blade than the usual case shown in FIG. 12 (d).

Such non-orthogonal data is subjected to the gridding for image reconstruction and transformed to orthogonal data. Also here, the appearance of artifacts specific to hybrid radial scan is prevented by the gridding on a grid having a smaller size than the matrix size of the final image. In other words, the gridding is performed on the grid whose pitch is almost the same as the spacing of trajectory 1302 enlarged by thinning. This orthogonal data contains artifacts because its field of view is narrower than that of the final image.

Whereas, in the gridding for obtaining a sensitivity distribution of each element coil, out of all non-orthogonal data only the data in the central part of the k-space, namely the data enclosed by the circle 703, is gridded on the corresponding grid region 708 in the same manner as the first embodiment. For example, the data is converted to the data on the orthogonal coordinate points of 256×256. This gridding is performed on the grid having an equal field of view to and exhibiting a lower spatial resolution than the final image, and satisfies the conditions for suppressing the appearance of artifacts of hybrid radial scan that the spacing of grid trajectories 709 should be almost equal to or larger than the trajectory spacing 1302. Zero (0) is set for other region of the region 708, and after applying a filter as required, two-dimensional Fourier transform is performed. The image thus obtained is used as a sensitivity distribution of each coil.

As described above, the MRI apparatus according to the present embodiment is principally the same as that according to the first embodiment, though the trajectory consists of multiple radial trajectories each having a different angle with regard to an origin of the k-space as a center and linear trajectories parallel to each radial trajectory.

According to the present embodiment, by keeping the data sampling speed constant, data acquisition time can be halved and the TR and TE shortened almost one half. In this case, imaging speed is practically four times higher.

The imaging sequence of hybrid radial type according to the present embodiment can be applied to the hybrid radial sequence of FSE type, for example.

Fifth Embodiment

The fifth embodiment is different from the aforementioned first to fourth embodiments in the point that non-orthogonal data sampling uses multiple types of RF pulse having different flip angle and therefore the multiple spokes or trajectories data contain data obtained with different flip angles.

According to the present embodiment, in the 2-D radial scan as shown in FIG. 3, for example, the measurement is performed by using multiple types of RF pulse 501 having different flip angles, say 10°, 30° and 60° and changing the flip angle cyclically at each repetition time. Such variable flip angle sampling is an effective means to reduce RF power and suppress specific absorption rate: SAR, and preferable for the sequential imaging such as dynamic imaging.

Non-orthogonal data 1500 obtained by this non-orthogonal data sampling is shown in FIG. 13 (a). In the figure, the difference of flip angle is denoted with a type of line used for drawing the spoke. For example, a solid-lined spoke is the data 1501 measured at the flip angle of 60°, a singly dotted lined spoke is the data 1502 measured at the flip angle of 30° and a double dotted lined spoke is the data 1503 measured at the flip angle of 10°. The figure does not show unmeasured spokes, but there are spokes to be measured between illustrated spokes in the usual radial scan.

First of all, this non-orthogonal data is gridded on the grid having an equal grid pitch to the spacing of spokes, for the purpose of image reconstruction. Namely, the gridding is performed on the grid having a smaller field of view than, and an equal spatial resolution to the final image. This is the same as the first to fourth embodiments. In the present embodiment, however, it is preferable to weight the data depending on the flip angle of non-orthogonal data in gridding. The orthogonal data thus obtained and subjected to the two-dimensional Fourier transform contains no radial scan-specific artifact, but contains aliased image elements due to a narrowed field of view.

Next, a sensitivity distribution is created for the operation for removing aliasing from the non-orthogonal data measured similarly. In the creation of a sensitivity distribution, out of the non-orthogonal data shown in FIG. 13(a) only the data having an equal flip angle is chosen and subjected to gridding. For example, as shown in FIG. 13 (b), the gridding is performed using only the data 1503 measured at the flip angle of 10°. In this example, of the data 1503 only the data near the center of k-space (data inside the circle 1504) is subjected to gridding and the Fourier transform after setting zero (0) in the periphery of the k-space. The obtained image data is used as a sensitivity distribution of element coils. Alternately, as explained in the first embodiment, a small-sized map (for example, 64×64) is created by the Fourier transform with less matrix number instead of using zero-filling. Thereafter, a sensitivity map of the same size as a target image (for example 256×356) is created by using interpolation in a real space (for example, spline interpolation).

By using the thus created sensitivity distribution of each element coil, the aliasing removal operation is performed on the image data (real space data) having aliasing components obtained for each element coil so as to synthesize a final image.

As explained above, the MRI apparatus according to the present embodiment is principally equivalent to the first embodiment. However, the first k-space data is measured by using high-frequency magnetic field pulse having multiple different flip angles, and the signal processing unit 407 obtains the second k-space data by using only the data measured with a high-frequency magnetic field pulse of a single flip angle.

According to the present embodiment, even in the imaging applying variable flip angle sampling in the non-orthogonal data sampling, data acquisition time is shortened and a parallel imaging for the operation in a real space can be performed.

Although the case in which the data obtained with a flip angle 10° is used as a data for sensitivity distribution, any data having other flip angle can be used. However, as the data obtained with a larger flip angle tends to have stronger contrast of image, it is preferable to use the data obtained with a smaller flip angle to obtain a sensitivity distribution.

The present embodiment can be applied not only to radial scan but also to hybrid radial scan. In the hybrid radial scan, the measurement is performed by changing a flip angle of spokes comprising one blade, for example, and the data of the spoke with the same flip angle is selected from each blade and used for creating a sensitivity distribution.

In addition, in the above mentioned embodiment, the signal processing unit 407 may be configured to perform a process, as an operation based on parallel imaging, to find data on an orthogonal grid point between grid points, on which the first k-space data is re-allocated, by using both the data on the grid where the first k-space data is reallocated and a sensitivity distribution data.

INDUSTRIAL APPLICABILITY

According to the present invention, an operation method capable of high-speed parallel MRI in Cartesian imaging for non-Cartesian imaging sequence is proposed to make the application of parallel MRI to the non-Cartesian imaging sequences easier. As a result, in the products equipped with the Cartesian imaging sequence of SMASH or SENSE method, practical non-Cartesian imaging sequence can be applied without developing non-Cartesian type having different methods of operation.

The invention claimed is:

1. A magnetic resonance imaging apparatus comprising
   multiple receiver coils each having a sensitivity distribution data different from each other,
   a measurement control unit that performs measurement of data on trajectory of a k-space, at least a part of the trajectory being non-parallel to the axis of the k-space, and for obtaining a first k-space data for each receiver coil, and
   an image reconstructing unit that obtains a target image using the first k-space data and the sensitivity distribution data of each receiver coil by applying an operation based on parallel imaging,
   wherein the image reconstructing unit obtains a second k-space data by reallocating at least a part of the first k-space data on orthogonal grid points of the k-space, and obtains the target image by performing the operation based on parallel imaging using the second k-space data and the sensitivity distribution data of each receiver coil, and
   wherein the orthogonal grid points of the k-space, on which at least a part of the first k-space data is reallocated, corresponds to a field of view narrower than that of the target image.

2. The magnetic resonance imaging apparatus according to claim 1,
   wherein the orthogonal grid points of the k-space, where at least a part of the first k-space data is re-allocated, corresponds to a spatial resolution equal to that of the target image.

3. The magnetic resonance imaging apparatus according to claim 1,
   wherein the image reconstructing unit reallocates at least a part of the first k-space data on the orthogonal grid points corresponding to a field of view narrower than that of the target image, in two orthogonal directions.

4. The magnetic resonance imaging apparatus according to claim 1,
   wherein the image reconstructing unit reallocates at least a part of the first k-space data on the orthogonal grid points corresponding to a field of view narrower than that of the target image, in one direction of two orthogonal directions.

5. The magnetic resonance imaging apparatus according to claim 1,
wherein the measurement control unit makes at least a part of the trajectory spacing wider than a spacing corresponding to the field of view and spatial resolution of the object image, and performs measurement of data on the trajectories having the spacing set to wider, and
the image reconstructing unit controls a pitch of the orthogonal grid points, where the first k-space data is reallocated, in accordance with the spacing of the trajectory for which data measurement is performed.

6. The magnetic resonance imaging apparatus according to claim 5,
wherein the trajectory consists of multiple radial trajectories each having a different angle with regard to an origin of the k-space as a center.

7. The magnetic resonance imaging apparatus according to claim 6,
wherein the measurement control unit makes the trajectory spacing in a predetermined direction different from the trajectory spacing in the other direction.

8. The magnetic resonance imaging apparatus according to claim 5,
wherein the trajectory consists of multiple radial trajectories each having a different angle with regard to an origin of the k-space as a center and linear trajectories being parallel to each of the radial trajectories.

9. The magnetic resonance imaging apparatus according to claim 1,
wherein the trajectory is a curvilinear trajectory spirally expanding from an origin as a starting point to a periphery of the k-space.

10. The magnetic resonance imaging apparatus according to claim 1,
wherein the image reconstructing unit obtains a third k-space data, for each receiver coil, by reallocating a part of the first k-space data on orthogonal grid points having a field of view equal to that of the target image and a spatial resolution lower than that of the target image, and obtains the sensitivity distribution data using the third k-space data.

11. The magnetic resonance imaging apparatus according to claim 10,
wherein the image reconstructing unit obtains the third k-space data by reallocating data around an origin of the k-space, among the first k-space data, on orthogonal grid points around the origin.

12. The magnetic resonance imaging apparatus according to claim 11,
wherein the image reconstructing unit allocates zero to orthogonal grid points of the third k-space other than the orthogonal grid points around the origin, where the first k-space data is reallocated.

13. The magnetic resonance imaging apparatus according to claim 10,
wherein the image reconstructing unit obtains the third k-space data by reallocating data in a high data-density region of the first k-space data, where a data pitch is equal to or less than the pitch of the orthogonal grid points of the k-space, on the corresponding region of the orthogonal grid points.

14. The magnetic resonance imaging apparatus according to claim 1,
wherein the first k-space data is measured using high-frequency pulses of different flip angles, and
the image reconstructing unit obtains the second k-space data by using only data measured using high-frequency pulses of a same flip angle.

15. The magnetic resonance imaging apparatus according to claim 1,
wherein the image reconstructing unit, for the operation based on the parallel imaging, obtains an aliased image, for each receiver coil, by performing a Fourier transform of the second k-space data, and obtains the target image by performing a matrix operation using the aliased image and the sensitivity distribution data of each receiver coil.

16. The magnetic resonance imaging apparatus according to claim 1,
wherein the image reconstruction unit, for the operation based on the parallel imaging, finds data of orthogonal grid points intervening the orthogonal grid points, where the first k-space data is reallocated, by using the data of the orthogonal grid points, where the first k-space data is reallocated, and the sensitivity distribution data.

17. A magnetic resonance imaging method for imaging a subject using multiple coils each having a different sensitivity distribution so as to obtain a target image of the subject, comprising,
a step of acquiring a first k-space data, for each receiver coil, by a measurement control unit, by measuring data on a trajectory, at least part of which is non-parallel to the axis of a k-space,
a step of obtaining a second k-space data, for each receiver coil, by the measurement control unit which controls to reallocate at least a part of the first k-space data on orthogonal grid points of the k-space, which corresponds to a field of view narrower than that of the target image, and
a step of performing an operation based on parallel imaging by an image reconstruction unit by using the second k-space data and the sensitivity data of each receiver coil to obtain the target image.

18. The magnetic resonance imaging method according to claim 17,
wherein the orthogonal grid points of the k-space, where at least a part of the first k-space data is reallocated, corresponds to a spatial resolution equal to that of the target image.

19. The magnetic resonance imaging method according to claim 17, further comprises,
a step of obtaining a third k-space data, for each receiver coil, by reallocating a part of the first k-space data on orthogonal grid points of the k-space having a field of view equal to that of the target image and a spatial resolution lower than that of the target image, and obtaining the sensitivity distribution data using the third k-space data.

20. The magnetic resonance imaging method according to claim 17,
wherein the operation based on parallel imaging is a process consisting of obtaining an aliased image for each receiver coil by performing a Fourier transform on the second k-space data, and obtaining the target image by performing a matrix operation using the aliased image and the sensitivity distribution of each receiver coil.

* * * * *